United States Patent
Ardezzone

(12) 
(10) Patent No.: US 6,467,827 B1
(45) Date of Patent: Oct. 22, 2002

(54) IC WAFER HANDLING APPARATUS INCORPORATING EDGE-GRIPPING AND PRESSURE OR VACUUM DRIVEN END-EFFECTORS

(76) Inventor: Frank J. Ardezzone, P.O. Box 242, Santa Clara, CA (US) 95052-0242

( * ) Notice: Subject to any disclaimer, the term of this patent is extended or adjusted under 35 U.S.C. 154(b) by 0 days.

(21) Appl. No.: 09/431,041

(22) Filed: Oct. 30, 1999

(51) Int. Cl.⁷ .......................... B25J 15/00; B65G 47/90
(52) U.S. Cl. .................. 294/119.3; 294/99.1; 294/907; 414/941; 901/36; 901/39
(58) Field of Search ............................... 294/1.1, 6, 16, 294/27.1, 28, 29, 31.1, 33, 86.4, 87.1, 88, 99.1, 99.2, 100, 101, 102.1, 103.1, 104, 113, 114, 116, 119.3, 907, 64.1; 414/941; 901/36, 37, 39

(56) References Cited

U.S. PATENT DOCUMENTS

| | | | |
|---|---|---|---|
| 3,056,625 A | * 10/1962 | Timmerman | 294/119.3 X |
| 3,374,024 A | * 3/1968 | Reynolds | 294/16 |
| 3,961,819 A | * 6/1976 | Yocum | 294/6 X |
| 4,079,979 A | * 3/1978 | Schweizer | 294/33 |
| 4,410,209 A | 10/1983 | Trapani | |
| 4,432,577 A | * 2/1984 | Equitz et al. | 294/16 |
| 4,452,480 A | * 6/1984 | Maier et al. | 294/27.1 X |
| 4,586,743 A | 5/1986 | Edwards | |
| 4,627,151 A | 12/1986 | Mulholland | |
| 4,676,709 A | 6/1987 | Bonora | |

(List continued on next page.)

FOREIGN PATENT DOCUMENTS

| | | | | |
|---|---|---|---|---|
| FR | 2653415 | * | 4/1991 | 294/119.3 |
| JP | 155531 | * | 7/1987 | 414/941 |
| SU | 1400878 | * | 6/1988 | 294/119.3 |

OTHER PUBLICATIONS

US 6,227,585, 5/2001, Govzman et al. (withdrawn)*

*Primary Examiner*—Johnny D. Cherry
(74) *Attorney, Agent, or Firm*—John J. Leavitt; George M. Cooper

(57) ABSTRACT

Presented is an end-effector for grasping integrated circuit wafers with a talon-like device that effectively grips an arcuate peripheral "free zone" of the wafer-without effecting contact of the wafer in a manner to contaminate it. Structurally, in one aspect of the invention, the end-effector or talon-like device is formed by-confronting top and bottom plate members configured to form a "shell" within which is displaceably mounted a member which, when selectively displaced in one direction by the imposition-of-an-appropriate force, opens a normally-closed gripping member for receiving the arcuate peripheral "free zone" of the wafer and when selectively displaced in the opposite direction by the removal of the opening force tightly grips the arcuate peripheral "free zone" of the wafer to releasably retain it attached to the end-effector, from which it may selectively be released by the imposition of force in an opening direction that opposes and overcomes the force that effects gripping of the wafer. An indicator may be provided to signal the proper positioning of the wafer in relation to the end-effector, and a control system may be provided to effect opening and closing operation of the arcuate talon-like clamp.

33 Claims, 21 Drawing Sheets

U.S. PATENT DOCUMENTS

| | | |
|---|---|---|
| 4,715,637 A | 12/1987 | Hosoda et al. |
| 4,717,190 A | 1/1988 | Witherspoon |
| 4,720,130 A * | 1/1988 | Andou .................. 414/941 X |
| 4,770,590 A | 9/1988 | Hugues |
| 4,775,281 A | 10/1988 | Prentakis |
| 4,778,332 A | 10/1988 | Byers et al. |
| 4,818,169 A | 4/1989 | Schram |
| 4,834,232 A * | 5/1989 | Freermann ........... 294/119.3 X |
| 4,848,814 A * | 7/1989 | Suzuki et al. ............... 294/6 X |
| 4,923,054 A | 5/1990 | Ohtani et al. |
| 4,955,649 A * | 9/1990 | Ishii et al. ................... 294/1.1 |
| 5,133,635 A | 7/1992 | Malin et al. |
| 5,395,198 A | 3/1995 | Duffy |
| 5,474,641 A | 12/1995 | Otsuki et al. |
| 5,556,147 A | 9/1996 | Somekh et al. |
| 5,810,935 A | 9/1998 | Lee et al. |
| 5,851,041 A | 12/1998 | Anderson |
| 6,217,275 B1 * | 4/2001 | Seki .................... 294/119.3 X |

\* cited by examiner

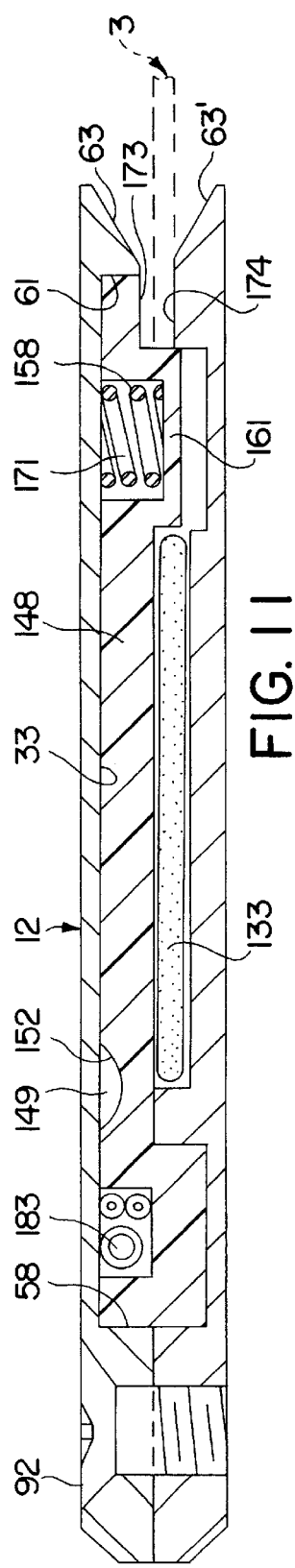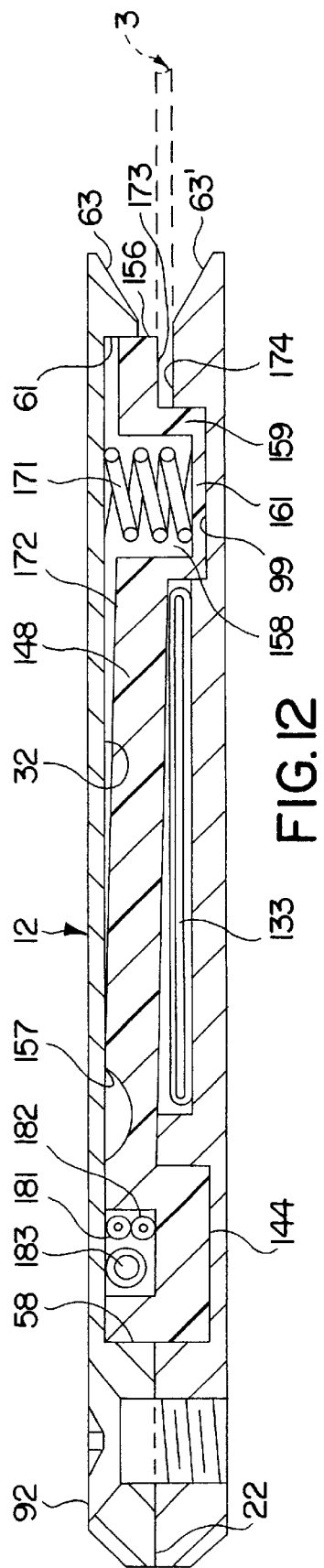

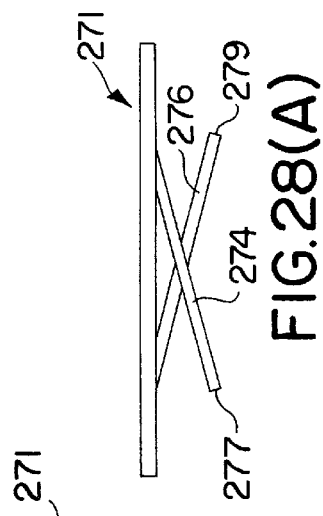
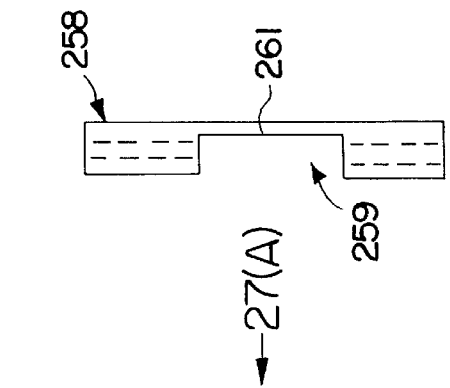
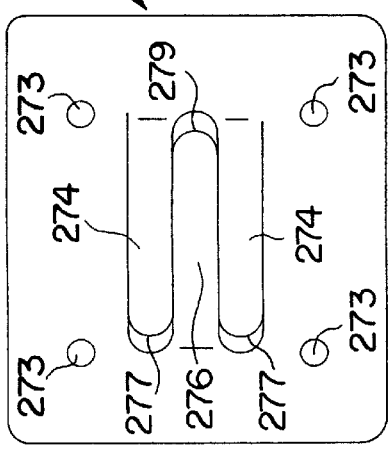
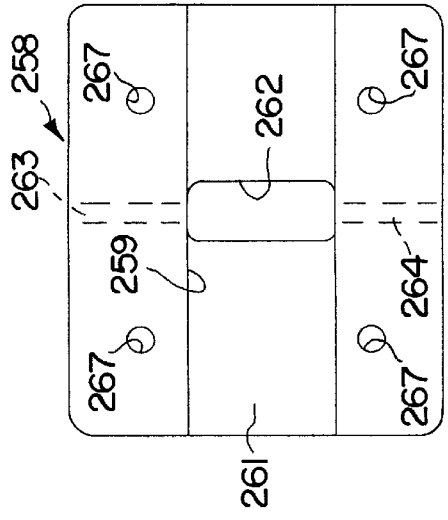
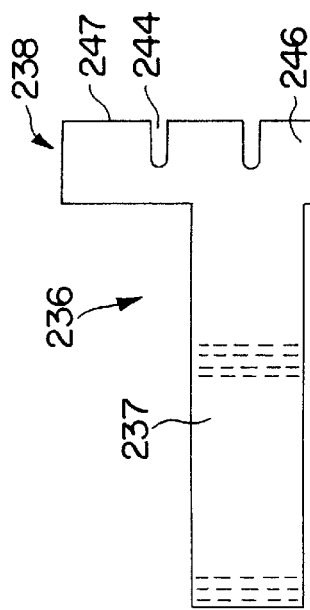
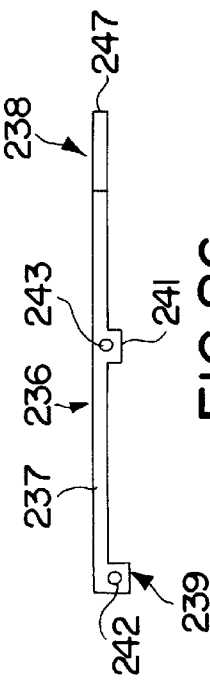

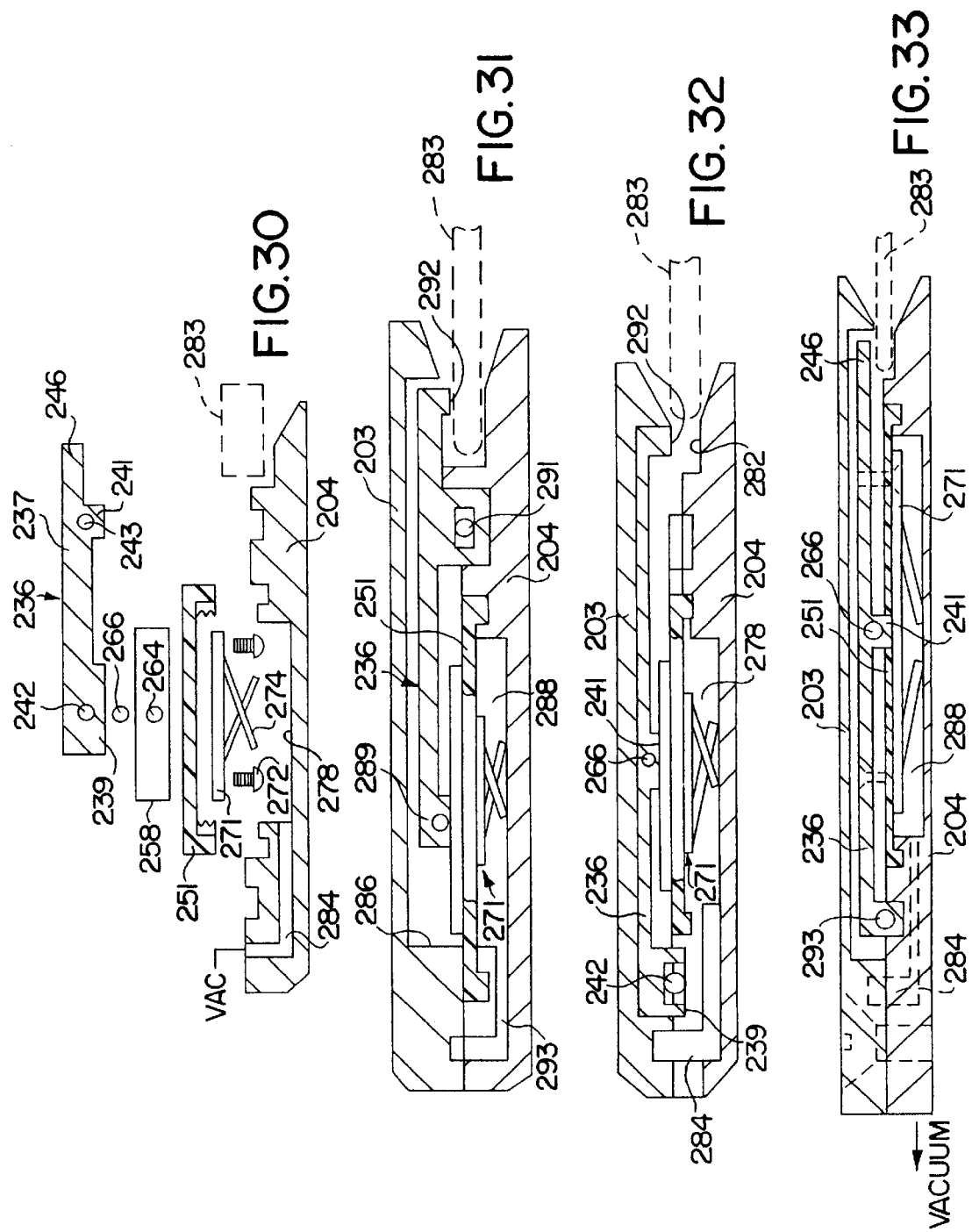

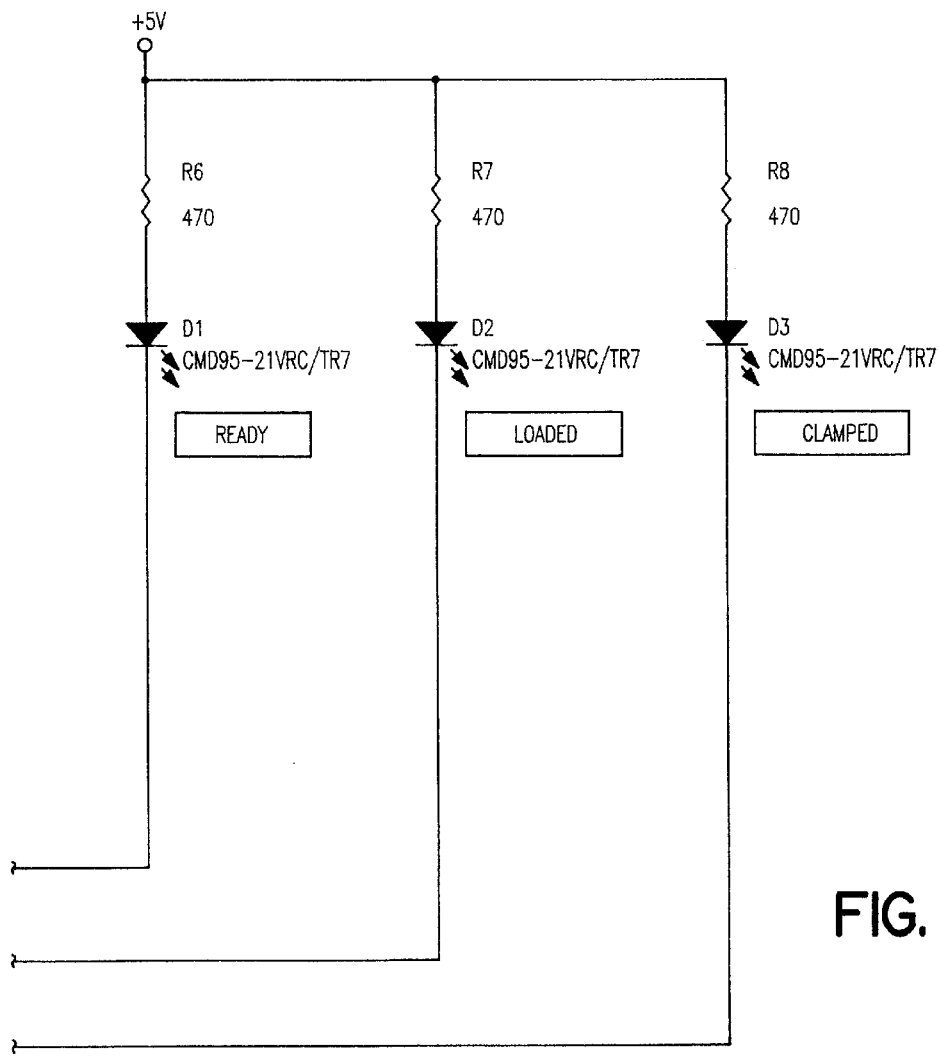
FIG. 35(C)
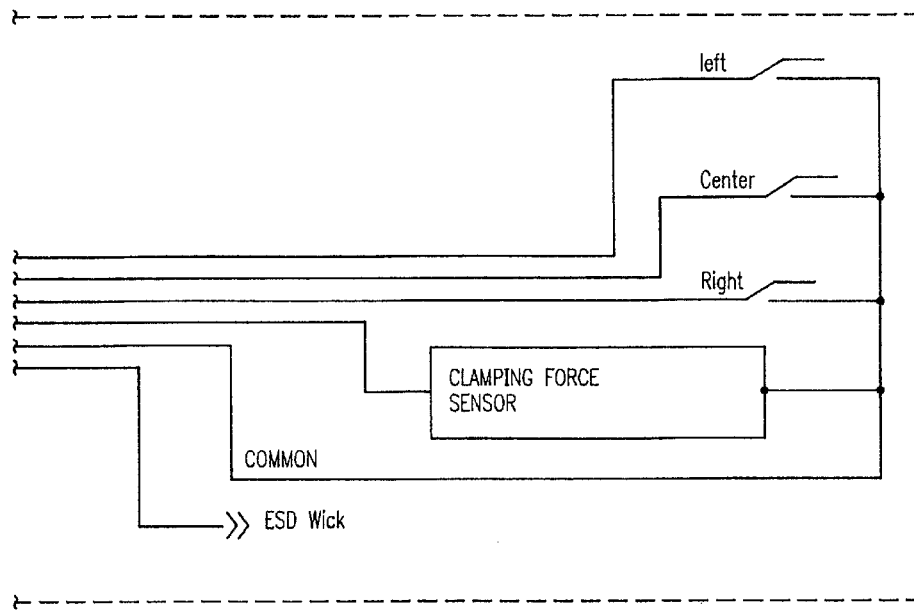

IC WAFER HANDLING APPARATUS INCORPORATING EDGE-GRIPPING AND PRESSURE OR VACUUM DRIVEN END-EFFECTORS

BACKGROUND OF THE INVENTION

In the manufacture of integrated circuit wafers and other devices, such as disks for CDs and computer hard disk drives, methods and apparatus have been developed for effecting the manufacture of the integrated circuit wafers and other devices in ultra-clean environments as free as possible from any source of contamination that might adhere to the semiconductor wafer or other such devices. It has been found that these essentially sterile conditions can best be achieved by manufacturing these devices, including IC wafers, in "clean rooms" where semiconductor-wafers of various sizes, e.g., 4,6, 8 and 12 in. in diameter are processed, these devices and wafers having various thicknesses averaging about 0.030" and being flat to very close tolerances. In the case of semiconductor wafers, each contains a multiplicity of independent integrated circuits or "chips" embedded therein, and the wafers are preferably handled in their wafer-form to efficiently effect the mass production and testing of the independent integrated circuits imbedded therein.

It is in this handling and manipulation of the completed wafers or other devices where the specter of contamination from an outside source frequently arises. Ideally, each wafer or other device would be moved or transferred from one location to another, during manufacture and thereafter, without having its top or bottom surfaces touched by any means, human or mechanical, this to prevent contamination of the top and bottom surfaces of the wafer. Accordingly, one of the principal objects of the present invention is the provision of a method and apparatus or device that may be selectively attached to and detached from an integrated circuit wafer or other device without contaminating the sensitive active areas of the surfaces of the wafer or other device.

One of the conventional methods for handling integrated circuit wafers is the use of an "end-effecter" that comprises an arm attached at its proximal end to a robotic manipulation mechanism and the source of negative pressure, i.e., a vacuum source. A channel is formed in the end defector, with the proximal end of the channel communicating with the vacuum source while the distal end of the channel opens onto a top surface on or near the distal end of the arm that abuts against the bottom side of the wafer, the wafer thus being et "sucked" or drawn against the top surface of the end-effector by the negative or "vacuum" pressure imposed on the bottom surface of the wafer. Much development effort has been expended to develop various types of structures that utilize this method of attachment of a manipulation arm or "end-defector" to the underside of an integrated circuit wafer, and numerous patents have issued illustrating and describing these types of devices. A sampling of these types of patent is as follows:

| | | |
|---|---|---|
| 4,627,151 | 4,720,130 | 4,778,332 |
| 4,923,054 | 5,395,198 | 5,556,147 |

However, such development efforts have not overcome the fact that the top surface of the end-effector that touches the wafer, top or bottom surface, may itself be contaminated and that such contamination may be transferred to the wafer. Another disadvantage of the vacuum clamping type of end-effecter wafer handling system is the risk of an interruption of the vacuum pumping system resulting from a power failure or a vacuum system leak that could cause disengagement of the wafer from the end-effector with consequent loss of the wafer through displacement laterally or vertically, with attendant striking of adjacent structures by the wafer, resulting in chipping or shattering of the wafer.

Much development effort has been expended to mitigate the disadvantages of end-effectors that utilize vacuum engagement end-effectors, and this development effort has generally been directed to the design of devices that operate by grasping the wafer in a manner to impose radially directed forces on the circumferential peripheral edge of the wafer, i.e., forces imposed in a direction perpendicular to the central axis of the wafer. A sampling of devices utilizing this method of grasping a wafer may be found in the following United States patents:

| | | |
|---|---|---|
| 4,410,209 | 4,586,743 | 4,715,637 |
| 4,717,190 | 5,133,635 | 5,474,641 |
| 5,810,935 | | 5,851,041 |

The patents listed above have resulted from a preliminary patentability and novelty search, and it appears that all of these patents are directed to the concept of the imposition of a radially inwardly directed force on the circumferential peripheral edge of the wafer.

Accordingly, another principal object of the present invention is the provision of a method and apparatus for gripping or grasping of an arcuate "free-zone" extending radially inwardly from a peripheral edge of a wafer by the imposition of a gripping force directed perpendicularly to the flat surface of the wafer or, stated in other words, by a gripping force imposed on an arcuate peripheral "fee-zone" surface portion of the wafer in a direction parallel to the central axis of the wafer, i.e., perpendicular to the "free-zone" surface portion of the wafer.

Another object to the present invention is the provision of an end-effector that eliminates the use of negative pressure or "vacuum" to engage itself to an integrated circuit wafer via surface contact as occurs with end-effectors that utilize the vacuum engagement principle and instead utilizes positive or negative pressure to activate a mechanism that grasps or releases the wafer in a non-active arcuate peripheral "Free-zone" or area.

A still further object of the invention is the provision of an end-defector device that utilizes fail-safe positive pressure to effect selective clamping or release of a wafer gripped by the end effecter so that the WAFER remains gripped by the end effecter even in the event of equipment failure.

Integrated circuit wafers may intentionally be manufactured with a "non-intrusion" area surrounded by a peripheral "free zone" of selected width of about 2 mm that is not occupied by it or used for the formation of integrated circuits in the wafer. It is important that this peripheral "free-zone" be as narrow as possible so as to maximize the number of integrated circuits that are formed in the "non-intrusion" area of the wafer.

Accordingly, it is yet another object of the invention to provide an end-effecter operable to selectively grip a wafer by the deployment of a gripping device on the peripheral "free-zone" of the wafer and the imposition of a sufficient gripping force applied perpendicularly to the top and bottom surfaces in the "free-zone" to prevent inadvertent release of the wafer while responding to positioning commands and which remains responsive to selectively applicable positive or negative fluid pressure to cause or cancel the positive gripping force to thus selectively grip or release the wafer.

A still further object of the invention is the provision of an end-defector device incorporating means for selectively gripping and releasing a substantial arcuate surface portion of the peripheral "free-zone" of an integrated circuit wafer on both top and bottom surfaces of the wafer surrounding the "non-intrusion" area and without intrusion into the "non-intrusion" area.

A still further object of the invention is the provision of an end-effector device for reliably gripping and effecting manipulation of an integrated circuit wafer without contact with the "non-intrusion" surface areas of the wafer, and comprising a selectively adjustable arcuate socket for receiving the arcuate "free-zone" of an integrated circuit wafer, the socket being actuable to an open condition for insertion of the wafer "free-zone" thereinto, and thereafter being actuable to resiliently grip or clamp onto the arcuate "free-zone" portion of the wafer to retain it gripped by the socket until selectively released therefrom.

A still further object of the invention is the provision of an end-effector device that is operable to selectively grip the arcuate peripheral "free-zone" of the wafer at circumferentially spaced locations thereon.

Yet another object of the invention is the provision of an end-effector device controllable manually or automatically by a control system responsive to input from sensors to effect opening of the socket to receive an arcuate peripheral "free-zone" of the wafer and to effect closing adjustment or clamping of the socket on the peripheral "free-zone" when the arcuate peripheral "free-zone" is properly inserted and seated in the socket.

The invention possesses other objects and features of advantage, some which, with the foregoing, will become apparent from the following description and the drawings. It is to be understood however that the invention is not limited to the embodiments illustrated and described since it may be embodied in various forms within the scope of the appended claims.

SUMMARY OF THE INVENTION

In terms of broad inclusion, the end-effector of the invention for grasping integrated circuit wafers comprises a talon-like device that effectively grips resiliently or otherwise, an arcuate peripheral "free-zone" of the wafer to enable risk-free manipulation of the wafer in whatever direction is appropriate and without effecting contact of the wafer in a manner to contaminate it. The end-effector of the invention may selectively be used in opposed pairs to grip large wafers by their diametrically opposed arcuate peripheral "free-zones" or, preferably, may be used individually to grip a single arcuate peripheral "free-zone" of a wafer. Structurally, in one aspect of the invention, the end-effector or talon-like device is formed by two confronting top and bottom plate members configured to form a "shell" within which or between which is displaceably mounted a member which, when selectively displaced in one direction by the imposition of an appropriate force, opens a normally closed gripping member for receiving the arcuate peripheral "free-zone" of the wafer and when selectively displaced in the opposite direction by the removal of the opening force tightly grips the arcuate peripheral "free-zone" of the wafer to releasably retain it attached to the end-effector, from which it may selectively be released by the imposition of force in an opening direction that opposes and overcomes the force that effects gripping of the wafer. It will of course be understood that the end-effector may be configured as a normally open device that is closed, i.e., by an appropriately directed force. Appropriate sensors, while not essential, are preferably provided to signal the proper positioning of the wafer in relation to the end-effector, and a control system may be provided responsive to the sensor signals to effect opening and closing operation of the arcuate talon-like socket or clamp.

BRIEF DESCRIPTION OF THE DRAWINGS

FIG. 11 is an enlarged vertical cross-sectional view taken in then plane indicated by the line 11–11 in FIG. 1 illustrating a spring pressure activated normally closed fail-safe end-effector embodiment illustrating the relationship of the components when the bladder is inflated so as to open the end-effector to receive a wafer. A portion of the wafer is shown in broken lines.

FIG. 12 is an enlarged vertical cross-sectional view taken in the same plane as FIG. 11 but showing the bladder deflated to cause the spring-pressed wafer receptor jaws of the end-effector to close and resiliently grasp the "free-zone" acruate edge portion of the wafer in a fail-safe manner through the imposition of retention forces applied perpendicular to the top and bottom surfaces of the wafer.

FIG. 25 is a plan view of one of the wafer "free-zone" gripping clamps shown apart from other structure FIG. 26 is an edge view of the clamp of FIG. 25 taken in the direction of the arrow 26 in FIG. 25.

FIG. 27 is a plan view of one of the mounting pistons adapted for mounting on the top surface of the diaphragm and on which the wafer-gripping clamp shown in FIGS. 25 AND 26 is adapted to be pivotally mounted.

FIG. 27(A) is an end elevational view of the mounting piston illustrated in FIG. 27 taken in the direction of arrow 27(A).

FIG. 28 is a plan view of a spring plate adapted to be mounted on the bottom surface of the diaphragm in conjunction with the mounting piston shown in FIG. 27.

FIG. 28(A) is an edge view of the spring plate illustrated in FIG. 28, taken in the direction of the arrow 28(A).

FIG. 30 is a fragmentary exploded view partly in vertical cross-section illustrating the positional relationships of the components of FIG. 29 embodying a normally-closed wafer clamping arm. A portion of the flange perimeter of the diaphragm is broken away for clarity.

FIG. 31 is a vertical cross-sectional view through a fail-safe end-effector assembly arranged with a spring-pressed normally-closed wafer-clamping member adapted to be opened by drawing a vacuum in the chamber below the diaphragm.

FIG. 32 is a vertical cross-sectional view through a standard normally-open end-effector assembly intended as a replacement for conventional end-effectors that vacuum-clamp a wafer, this assembly being spring-pressed into an open condition and clamped to a wafer by drawing a vacuum min the chamber below the diaphragm.

FIG. 33 is a vertical cross-sectional view of a slightly modified spring-pressed normally open end-effector adapted to be closed by drawing a vacuum in the chamber below the diaphragm.

FIGS. 35A–35C are schematics of the end-effector control system.

DESCRIPTION OF THE PREFERRED EMBODIMENTS

Figure 1:
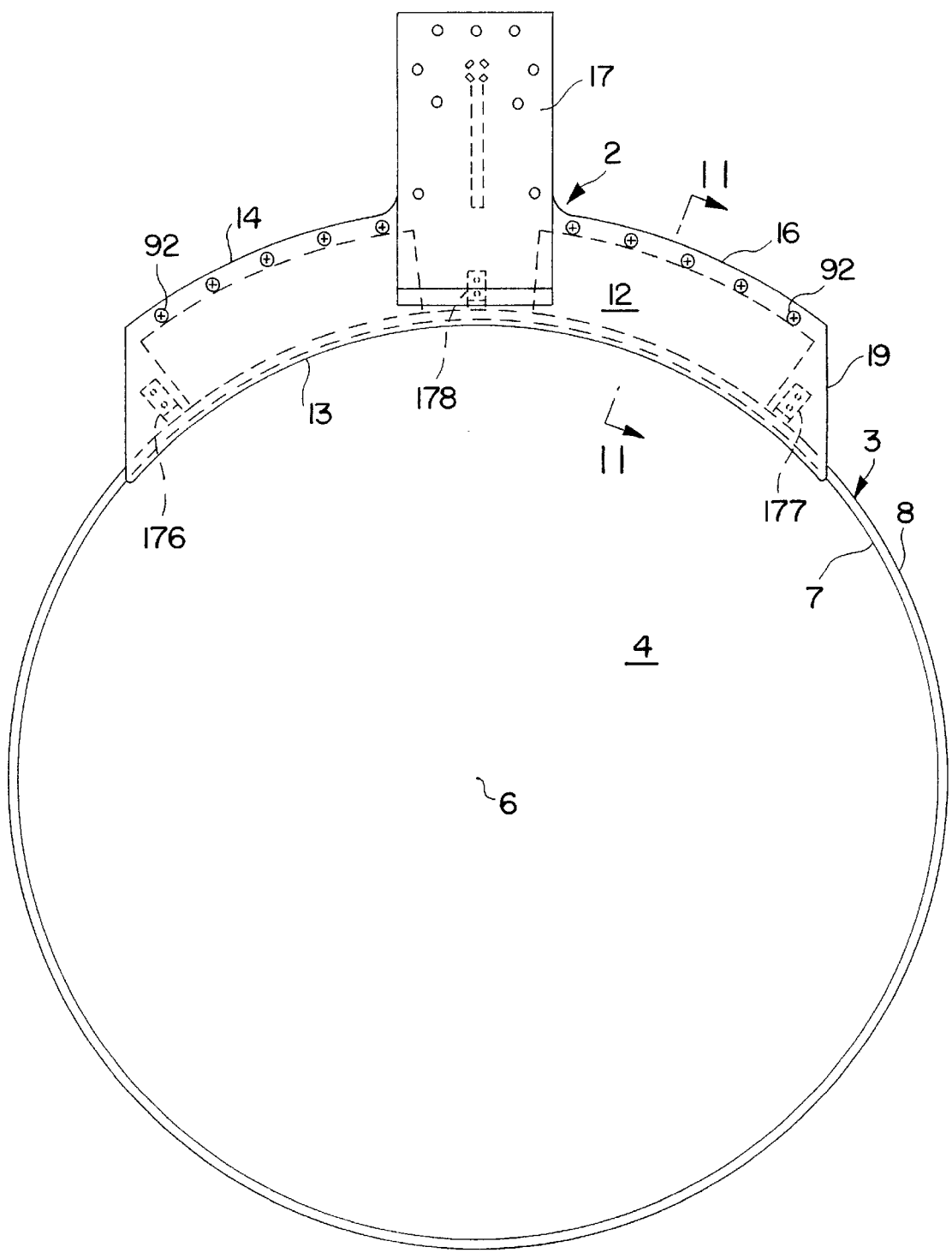
FIG. 1 is a top plan view of the end-effector of the invention shown in its position of non-intrusive gripping attachment to a peripheral "free-zone" of a wafer.

Referring to FIGS. 1 through 14, and specifically to FIG. 1 of the drawings, it will be noted that the end-effector designated generally by the numeral 2 is associated with a circular integrated circuit wafer designated generally by the numeral 3. The integrated circuit wafer 3 is provided with a "non-intrusion" circular area on its top surface 4 that extends radially outwardly from the center 6 of the wafer to a circular perimeter designated generally by the numeral 7. The circular perimeter 7 defines the area on the face of the wafer on which are embedded the individual integrated circuits in the structure of the wafer. The perimeter 7 that defines the "non-intrusion" area of the wafer lies approximately 2 mm or 0.0787" from the outer periphery 8 of the wafer. It is the primary purpose of the end-effector of this invention to grasp the wafer only in the annular area defined between the outer periphery 8 of the wafer and the outer perimeter 7 of the "non-intrusion" area of the wafer within which the integrated circuits are contained. By restricting gripping of the wafer by the end-effector 2 to an acruate portion of this annular band of approximately 2 mm, it will be seen that there is only a miniscule or no possibility that the surface of the wafer will be contaminated by the end-effector since no portion of the end-effector comes into contact with the "non-intrusion" surface area of the top and bottom of the wafer.

As stated above in the objects of the invention, the end-effector 2 is operative to selectively grip or grasp or clamp onto a finite arcuate portion of this narrow annular band with such tenacity and gripping force exerted perpendicular to the surface 4 of the wafer and parallel to the central axis of the wafer that the wafer may be transported by the end-effector at any velocity that imposes up to three times the force of gravity, or more, in any attitude in which the wafer may be moved from one position to a second position, or under appropriate robotic control, in which the wafer may be flipped from a horizontal attitude into a vertical attitude or vice versa, and similarly the wafer may be moved by robotic control in a circular path to reposition the wafer for whatever purpose is necessary during the manufacturing and testing process for the wafer.

Figure 2:
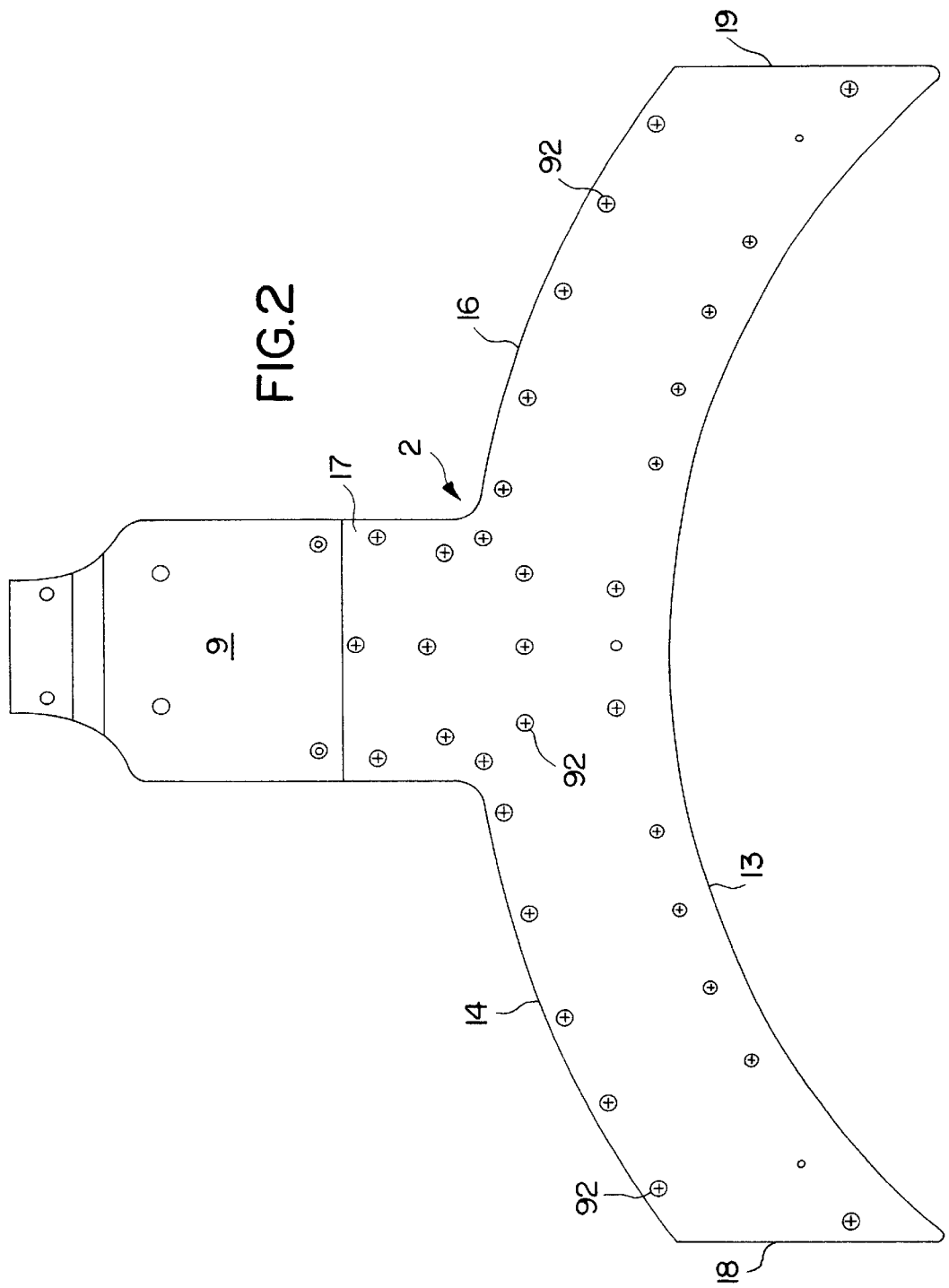
FIG. 2 is a top plan view of the end-effector of the invention apart from a wafer and equipped with an adaptor for connection of the end-effector to a conventional robotic control system.
Figure 15:
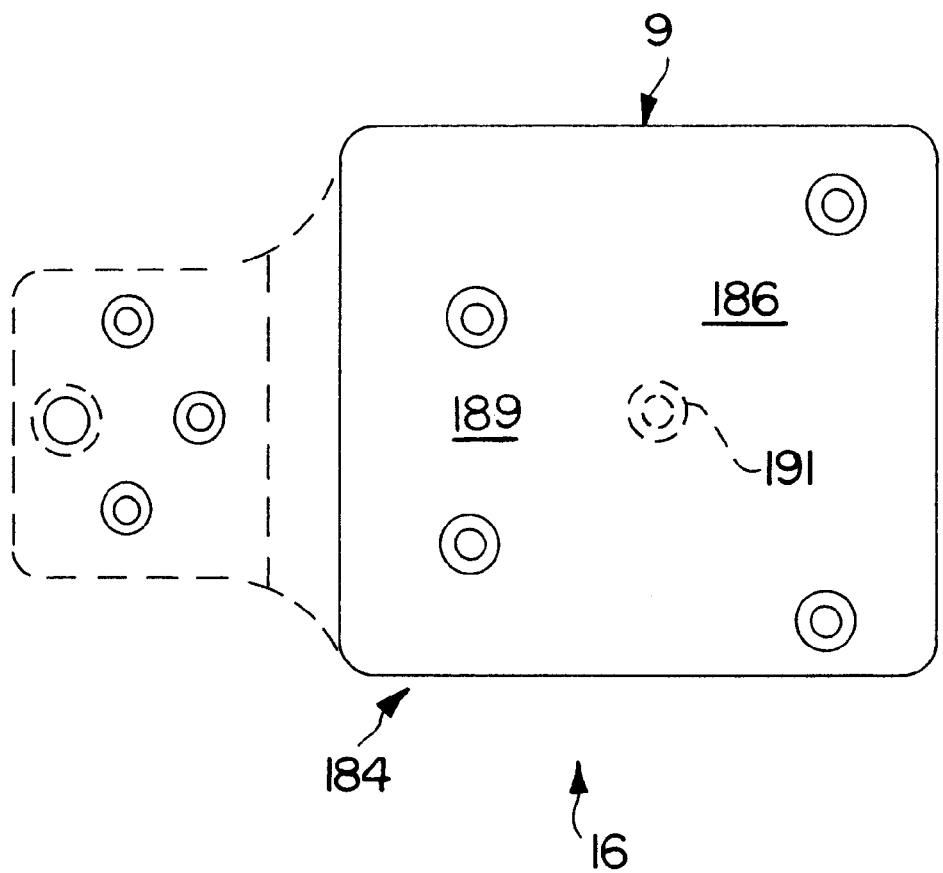
FIG. 15 is a top plan view of a specially configured mounting bracket adapted to be detachably interposed between the end-effector of the invention and an associated specific conventional robotic equipment. The specially configured portion of the bracket is shown in broken lines.
Figure 16:
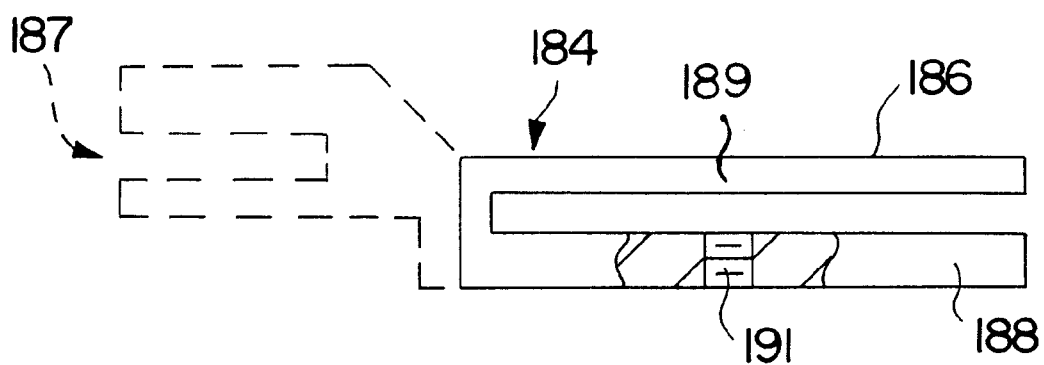
FIG. 16 is an edge view of the mounting bracket viewed in the direction of the arrow 16 in FIG. 15.

To accomplish this end, i.e., to enable maneuverability of the end-effector to grip the wafer only in an arcuate peripheral portion of the annular "free-zone" of the wafer without encroachment into the "non-intrusion" area 4 of the wafer, the end-effector 2 is preferably mounted on a robotic mechanism for accurate placement equipp3d as shown in FIG. 2 with a bracket designated generally by the numeral 9 and illustrated in FIGS. 2, 15 and 16.

In FIGS. 2, 15 and 16, the portion of the bracket shown in broken lines provides the ability to mount the end-effector on an already existing specific robotic mechanism of limited accessability. This portion of the bracket would be omitted from all standard end-effectors adapted to be mounted on most conventional robotic mechanisms.

Figure 3:
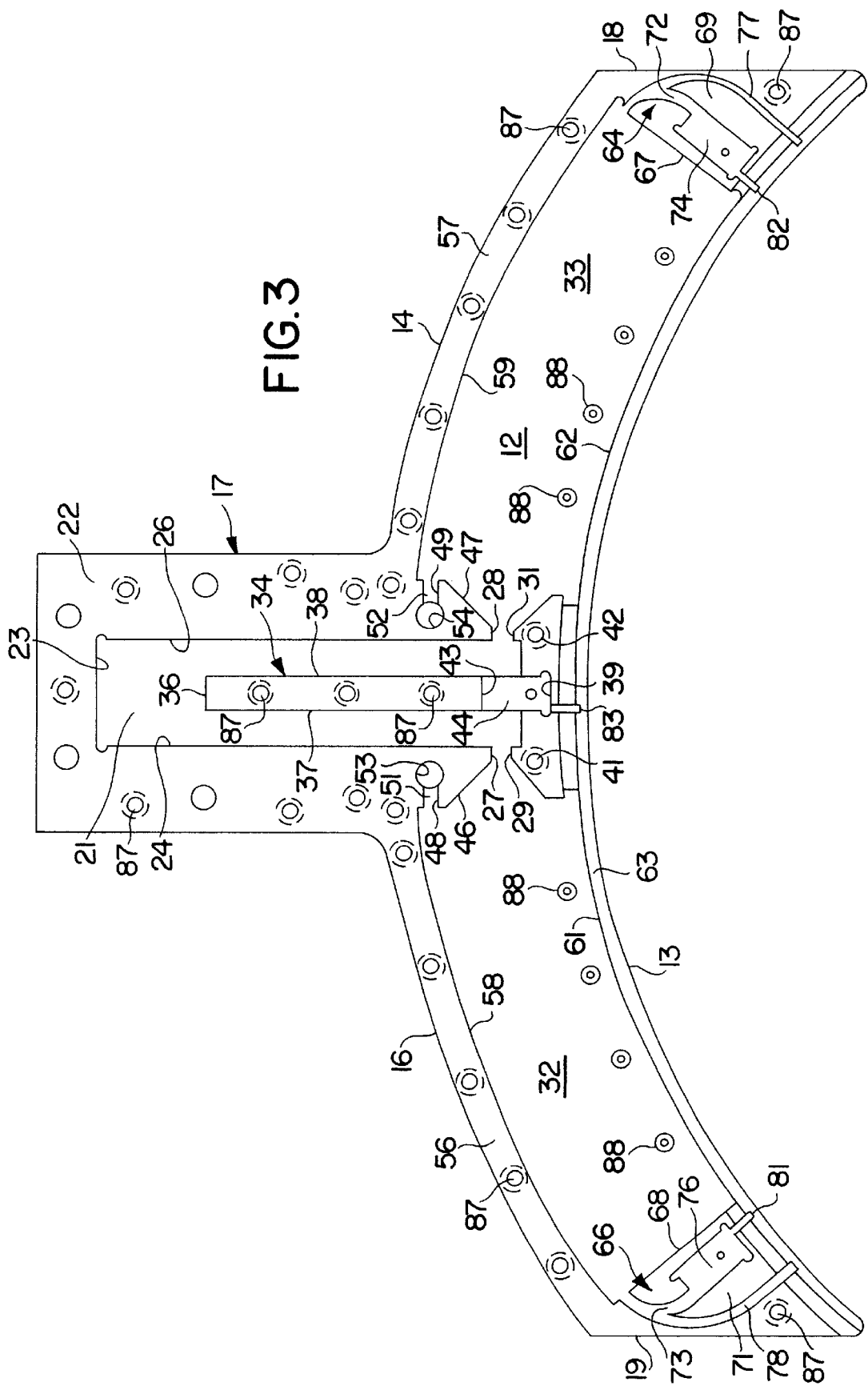
FIG. 3 is a bottom plan view of the monolithic top plate of the end-effector separated from the bottom plate and other components and illustrating the detailed construction of the interior of the top plate.
Figure 14:
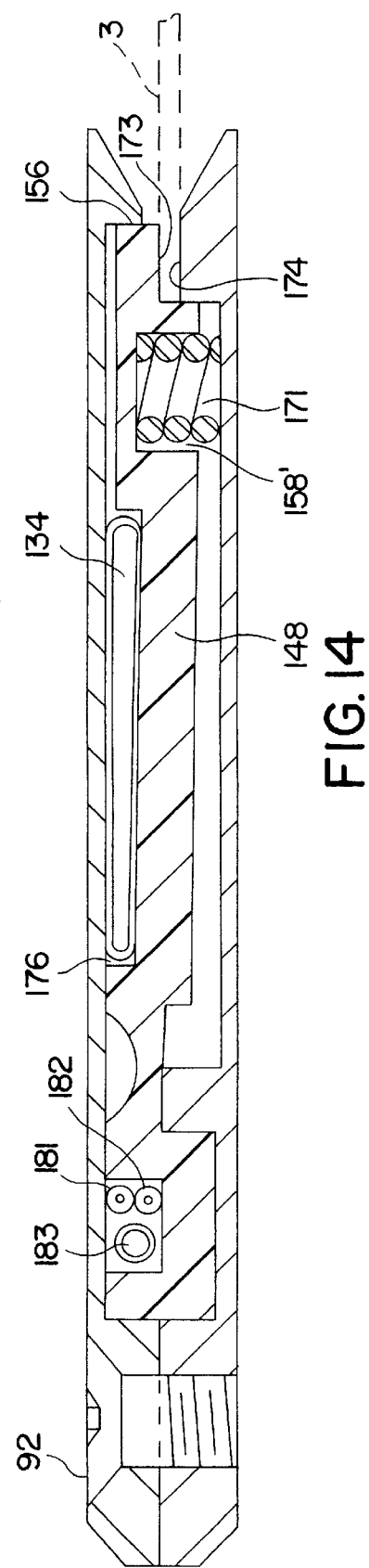
FIG. 14 is an enlarged vertical cross-sectional view similar to FIG. 13, but showing the bladder inflated and the arcuate peripheral edge portion of the wafer surrounding the "non-intrusion" area clampingly grasped by the end-effector.

For a better understanding of the means by which such grasping or gripping of a wafer by an end-effector is accomplished, reference is made to FIGS. 2 and 14, where, specifically in FIG. 2, there is illustrated a top plan view of an end-effector 2 formed in an arcuate configuration to provide a circularly arcuate leading edge 13, circularly arcuate rear edges 14 and 16 separated by a radially extending mounting extension 17 integral with the top plate 12 and which will be described in greater detail with reference to detailed illustrations of the top plate in FIG. 3. Additionally, the circularly arcuate top plate 12 is provided with end edges 18 and 19 and it will be seen that a robotic adaptor 9 is attached to the radially extending integral portion 17 of the top plate to facilitate mounting of the end-effector on conventional existing robotic mechanisms (not shown).

Referring to FIG. 3, this view illustrates the top plate 12 flipped over or inverted so as to illustrate the construction of the plate when viewed from its underside. As there shown, the underside of the top plate 12, which has by way of example a nominal thickness of approximately 2 mm but may be thinner or thicker as the need prescribes, is milled to provide an elongated recess 21 extending longitudinally of the radially extending mounting portion 17 of the top plate, being equidistant from opposite side edges and milled or otherwise formed into the bottom surface 22 of the top plate to provide an end wall 23 and parallel side walls 24 and 26. As shown in FIG. 3, the side walls 24 and 26 of the recess 21 extend downwardly where they are intercepted by end edges 27 and 28, respectively, which lie opposite end edges 29 and 31 which with the end edges 27 and 28 define laterally extending passageways between the interior of the recess 21 and the laterally and circularly extending arcuate recesses 32 and 33 which also may be milled or otherwise formed in the bottom surface of the top plate 12.

It should be noted that within the recess 21, there is formed a central beam designated generally by the numeral 34 and having an end edge 36 intercepted by side edges 37 and 38 that extend to adjacent an end wall 39 formed in laterally spaced pad portions 41 and 42. It should be noted that short of the end wall 39, the beam 34 is reduced in height to provide an abutment 43, resulting in the beam portion 44 below the abutment 43 being of lesser height than the main portion of the beam. It should also be noted that the end edges 27 and 28 that intercept the side edges 24 and 26, respectively, of the recess 21, are themselves intercepted by angularly diverging edges 46 and 47 that are intercepted, respectively, by the edges 48 and 49 of passageways 51 and 52, each of which communicate, respectively, with recesses 53 and 54. The purpose of these recesses, and the passageways 51 and 52, and the passageways defined between the end edges 27/29 and 28/31 will be explained hereinafter. It should be noted however at this point that the bottom surface 22 of the top plate lies in a common plane with the top surface of the beam 34, the pads 41 and 42, and the pads that are defined by the angularly diverging edges 46 and 47.

It should also be noted that the bottom surface 22 of the top plate as illustrated in FIG. 3 lies in the same plane as the arcuate peripheral edge surfaces 56 and 57 which are formed between the outer peripheries 14 and 16 and the inner arcuate peripheries 58 and 59 that define the associated boundaries of the recess 32 and 33, respectively. The opposite perimeters of the recesses 32 and 33 are defined by the arcuate edges 61 and 62, which edges are slightly below the plane of the surfaces 22, 56 and 57 and the surfaces of the pads 41 and 42. From the edges 61 and 62 that define the inner peripheral edge of the recesses 32 and 33, the top plate is chamfered in the area 63 so that a sloping surface is provided between the edges 61/62 and the inner peripheral edge 13 of the top plate.

At each opposite end of the top plate, adjacent the end edges 18 and 19, it will be seen that the surface of the top plate is-milled or otherwise formed, as by die-casting or molding, to provide a peninsula designated generally by the numeral 64 associated with the end edge 18, and a peninsula designated generally by the numeral 66 associated with the end edge 19 of the top plate. Side edges 67 and 68 of the peninsulas define the end edges, respectively, of the recesses 33 and 32, and with substantially parallel peninsulas 69 and 71, define passageways 72 and 73, respectively, into recesses 74 and 76 and passageways 77 and 78 which communicate with the chamfered edge 63 as shown. The purpose of the recesses 74 and 76 and the passageways 72 and 73 thereinto, together with the purpose of the passageways 77 and 78, will become apparent hereinafter. It is noted at this point however that the recesses 74 and 76 are connected by passageways 82 and 81, respectively, to the exterior of the end-effector, these passageways terminating or opening onto the chamfered edge 63 in the same manner that the ends of the passageways 77 and 78 terminate in the chamfered edge 63. In like manner, referring to the recess 44 formed in the beam 34, it will be noted that a passageway 83 is formed in the top plate to communicate between the recess 44 and the chamfered edge 63.

The end-effector illustrated in FIGS. 1 and 2 includes both a top plate 2 and a bottom plate designated generally by the numeral 86. These two plates are essentially mirror images of one another, as will be seen from a comparison of FIGS. 3 and 4, with only specific differences between the two plates which will be described in connection with FIG. 4. However, completing the description of the top plate illustrated in FIG. 3, it is noted that to effect connection of the top plate 2 to the bottom plate 86, the top plate is provided with a multiplicity of through-bores 87 formed in the extension 17 and in the peripheral edge portions 56 and 57 and in the beam 34 through which mounting screws may be inserted as will hereinafter be explained. In like manner, calling attention to the arcuate inner periphery 13, it will be noted that spaced radially outwardly from the peripheral edge 13 in both recesses 32 and 33 there are equally spaced four cylindrical studs 88, each of which is provided with a central through-bore communicating with the top surface of the top plate 12 and through which additional mounting screws may be inserted from the top surface so as to threadably engage complementary threaded bores formed in the bottom plate in which the mounting screws may be engaged as will hereinafter be explained.

Figure 4:
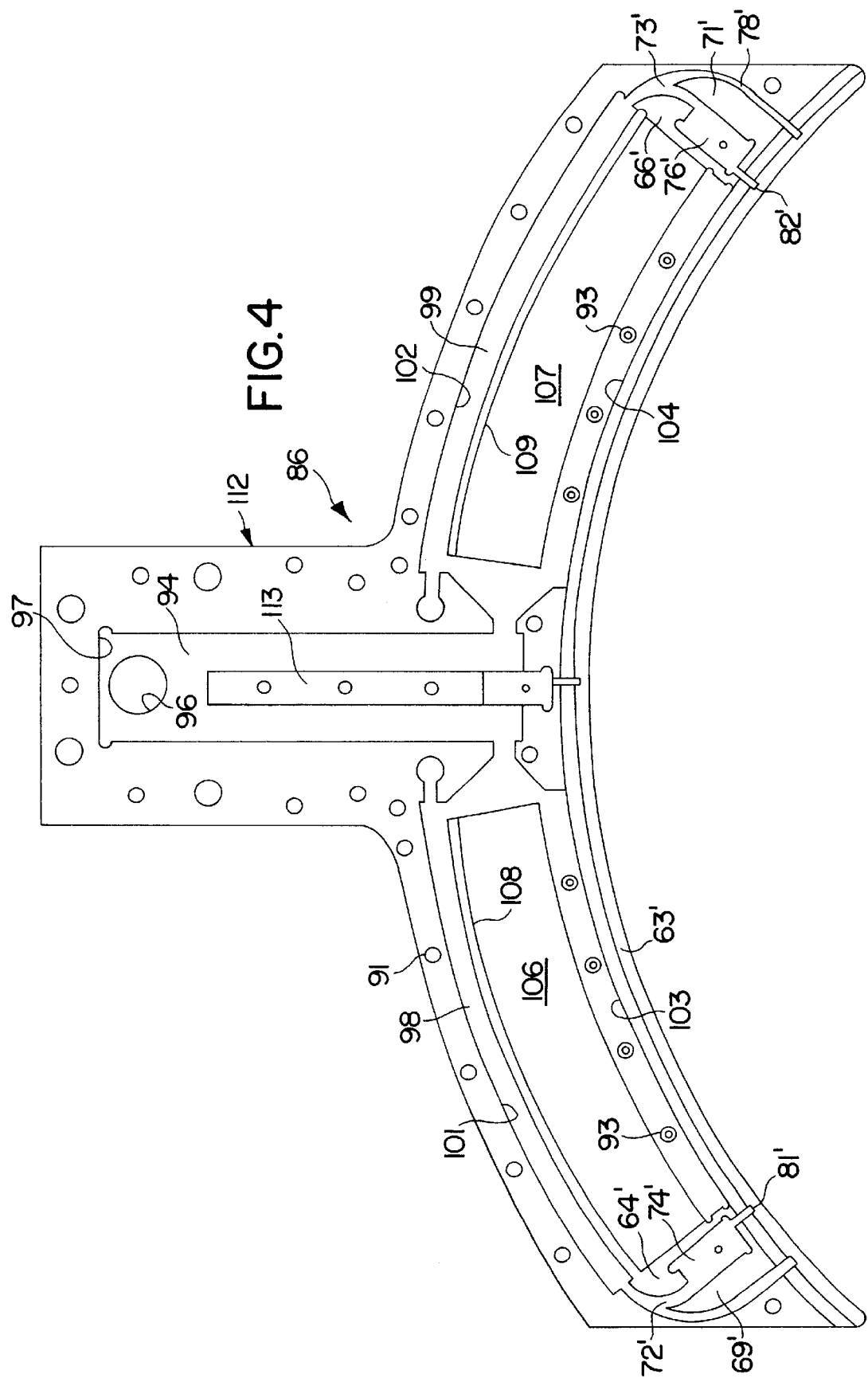
FIG. 4 is a top plan view of the monolithic bottom plate of the end-effector separated from the top plate and other components and illustrating the detailed construction of the interior of the bottom plate.

Referring now to FIG. 4, it will be seen from a comparison with FIG. 3 that the bottom plate corresponds in configuration with the top plate, and that the bores 91 corresponding in position with the bores 87 in the top plate, are in axial alignment with the bores 87 when the two plates are confrontingly superposed one upon the other, with the bores 91 being threaded to receive the threaded shanks of mounting screws 92 (FIG. 1). In like manner, the bored studs 88 extending integrally perpendicularly from the bottom of the recesses 32 and 33, are in axial alignment with the threaded mounting bores formed in similar studs 93 integral with a peripheral portion of the bottom plate and projecting perpendicularly therefrom.

The bottom plate 86 illustrated in FIG. 4 is also provided with an elongated recess 94 corresponding in size and position to the recess 21 in the top plate as shown in FIG. 3. However, in the bottom plate 86, a through-bore 96 is provided at the end of the recess adjacent the end edge 97 as shown. The purpose of this through-bore will be explained hereinafter. Additionally, while in the top plate the arcuate recesses 32 and 33 are flat in a direction transverse to the edges 58/59 and 61/62, respectively, in the bottom plate the recesses 98 and 99, corresponding to the recesses 32 and 33, are provided intermediate the defining arcuate edges 101/102 and 103/104, with integral elevated arcuate areas 106 and 107 that project a predetermined amount above the bottom surfaces of the recesses 98 and 99. With respect to the recess 98, the elevated area 106 is defined along one edge by a raised integral arcuate bead 108 that is parallel and spaced from the associated edge 101 of the recess 98.

In like manner, the elevated integral arcuate area 107 is defined along one edge by a raised integral arcuate bead 109 spaced from and parallel to the inner edge 102 of the recess 99. As with the top plate structure illustrated in FIG. 3, the bottom plate structure is provided with a radially outwardly projecting mounting extension 112 in which the recess 94 is centrally formed, together with the centrally aligned beam 113 which corresponds in position and dimensions with the beam 34 as illustrated in FIG. 3. All other aspects of the top plate 2 and the bottom plate 86 are essentially identical.

That being the case, it will be seen that when the top plate is superposed over the bottom-plate, the recesses 21 and 94 coincide to form a generally rectangular nacelle for a purpose which will hereinafter be explained. Similarly, the arcuate recesses 32 and 98 coincide to form an arcuate chamber between the top and bottom plates, as do the recesses 33 and 99. The peninsulas 64 and 66 formed in the top plate similarly coincide with the corresponding peninsulas 64' and 66' formed in the bottom plate, as do the peninsulas 69 and 71 coincide with the complementary peninsulas 69' and 71' formed on the bottom plate. It will thus be understood that passageways 73 and 78 complement similar coinciding passageways 73' and 78' formed in the bottom plate, the passageway 78' communicating with the chamfer 63' , while the passageways 72' and 73' communicate, respectively, with the recesses 74' and 76', which communicate respectively, with the passageways 81' and 82' that terminate in the chamfered area 63' as shown.

Figure 5:
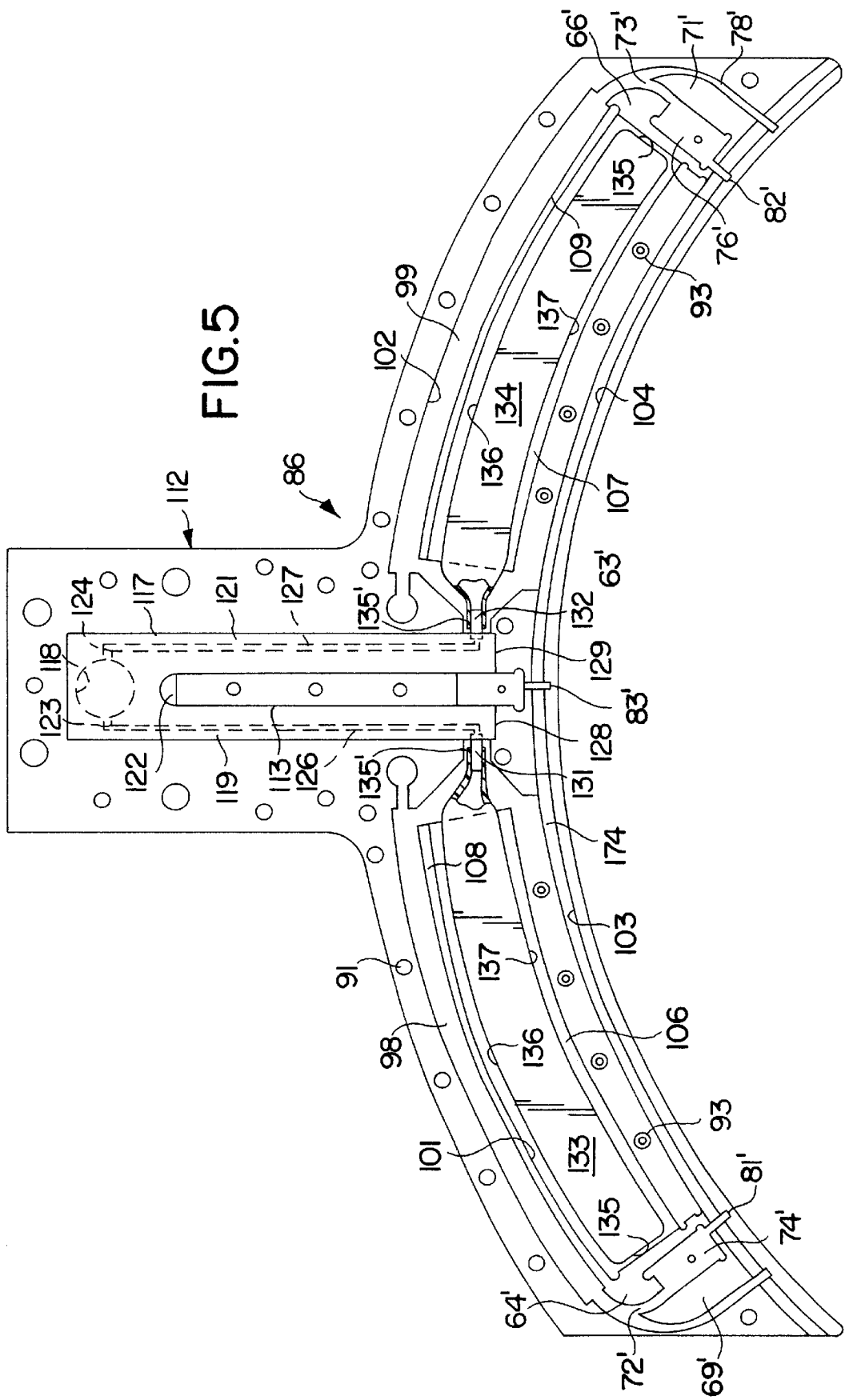
FIG. 5 is a top plan view of the interior of the bottom plate of the end-effector as shown in FIG. 4 but with a selectively actuable pressure actuated displacement assembly mounted therein.
Figure 6:
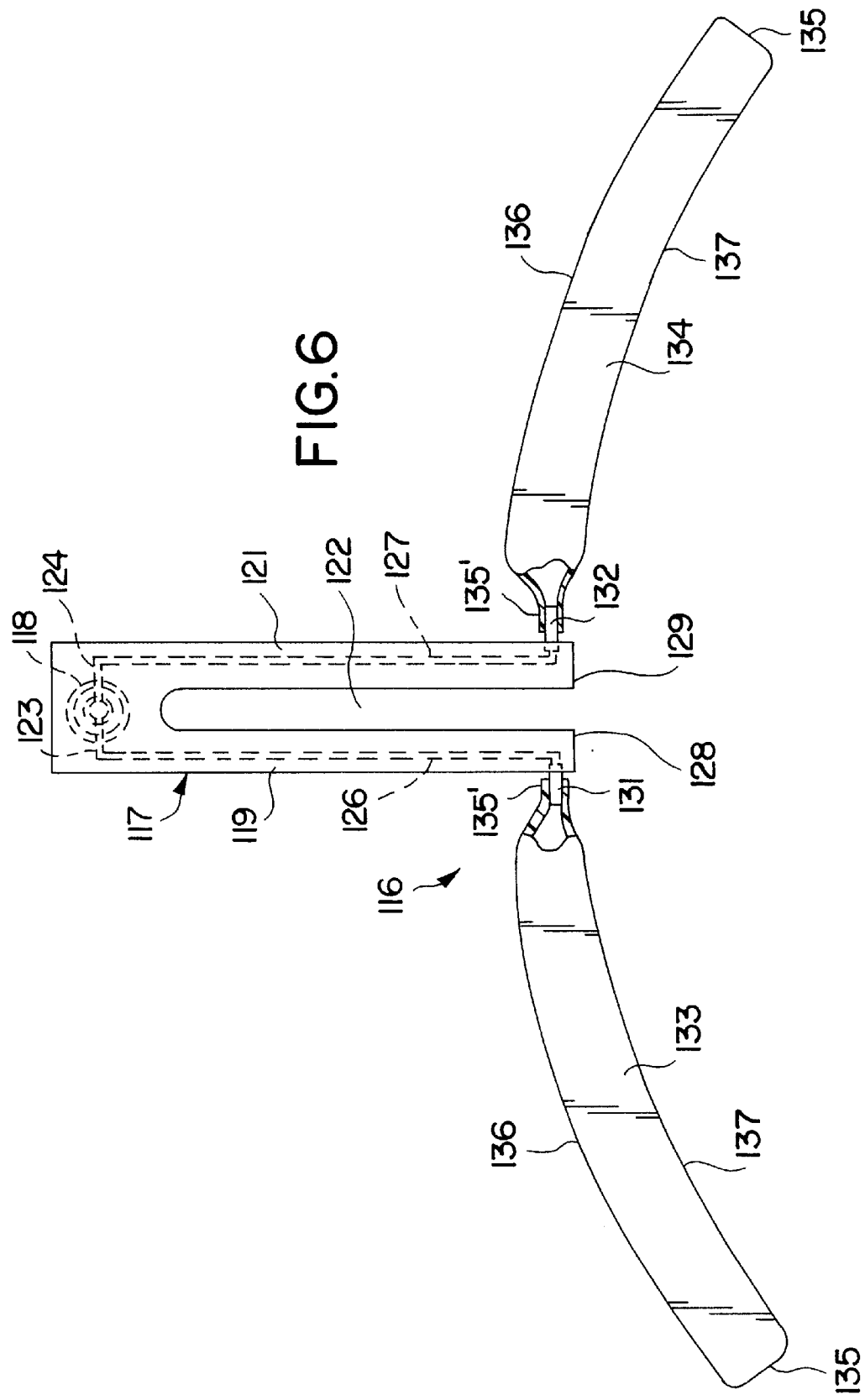
FIG. 6 is a top plan view of the selectively actuable pressure actuated displacement assembly shown apart from other structure.

Referring to FIGS. 5 and 6, it will be seen in FIG. 5 that the interior recesses or nacelles 98 and 99 of the bottom plate as illustrated in FIG. 4, are provided with the assembly designated generally by the numeral 116 and shown in FIG. 6 apart from other structure. The recess 94 (FIG. 4) receives the generally rectangular bifurcated manifold plate 117 provided on its underside with a recess 118 (FIG. 6) that sealingly communicates with the apertures 96 formed in the recess 94 of the bottom plate there illustrated. The manifold plate fits snugly into the recess 94, and is provided with latterly spaced leg members 119 and 121, the inner confronting edges of which provide a space 122 therebetween that snugly embraces the elongated beam 113 formed on the bottom plate.

Diametrically extending passageways 123 and 124 (FIGS. 5 and 6) formed in the manifold plate communicate with the recesses 118 and 94, and communicate also with elongated passageways 126 and 127 that extend to near the ends 128 and 129, respectively, of the leg members 126 and 127, where they in turn communicate with oppositely extending nipples 131 and 132, respectively, secured to the side edges of the leg members as shown. Sealingly secured adhesively to the nipples 131 and 132 are inflatable bladders 133 and 134, respectively, each of the bladders being formed of suitable material to fit on the raised portions 106 and 107 within recess 98 and 99 respectively.

As seen in FIGS. 5 and 6, the bladders 133 and 134 are initially flat, sealed at their distal ends 135, with their proximate ends 135' sealed about and secured to the nipples, so that the interiors of the bladders communicate with the interiors of the nipples so that fluid under pressure may selectively be injected through the aperture 96 and the passageway communicating therewith and into the bladders to effect their inflation and expansion under pressure, and their subsequent deflation when appropriate. In FIG. 5, it will be seen that the deflated bladders 133 and 134 are superimposed, respectively, upon the elevated areas 106 and 107 formed within the recesses 98 and 99. The bladders lie generally coextensive with the elevated areas, and opposite elongated side edges 136 and 137 of the bladders lie generally parallel to the beads 108 and 109 as seen in FIG. 5.

Figure 7:
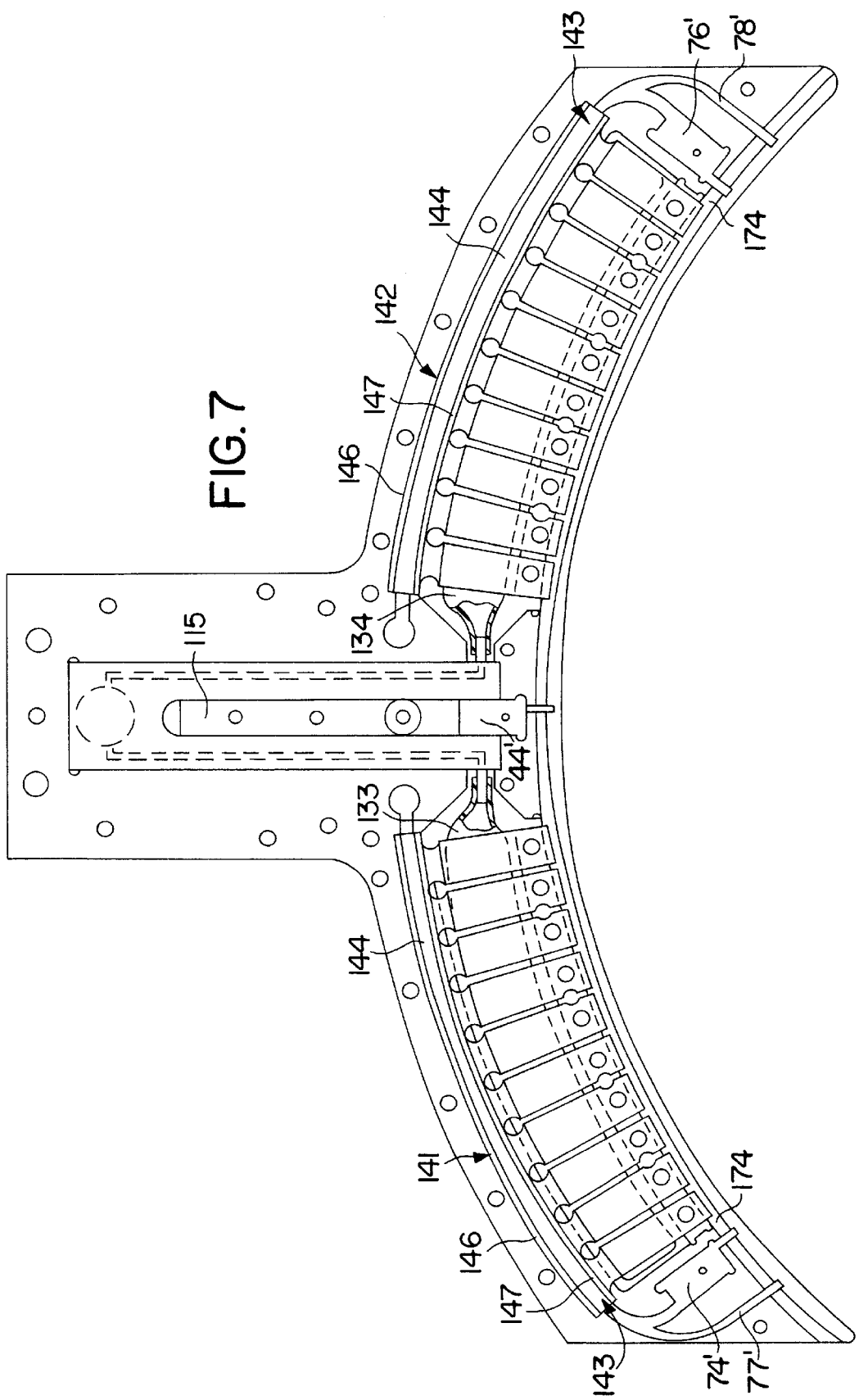
FIG. 7 is a top plan view similar to FIG. 5 and illustrating wafer peripheral edge gripping means mounted on the bottom plate and including a plurality of resiliently displaceable beams or tines extending radially across the selectively actuable pressure actuated displacement assembly.

With the bladder assembly thus mounted on the interior of the bottom plate 86, a first prefabricated comb-like wafer-clamping or gripping device designated generally by numeral 141 is superimposed over the bladder 133 as shown in FIG. 7, and a second prefabricated comb-like wafer-clamping or gripping device designated generally by the numeral 142 is superimposed over the bladder 134 as also shown in FIG. 7. The wafer-clamping or gripping devices 141 and 142 are identical to one another and the specific structure of each is illustrated enlarged in FIGS. 8, 9 and 10 for clarity. As there seen, each of the gripping devices constitutes a separate article of manufacture which may be formed by machining or injection molding.

Figure 8:
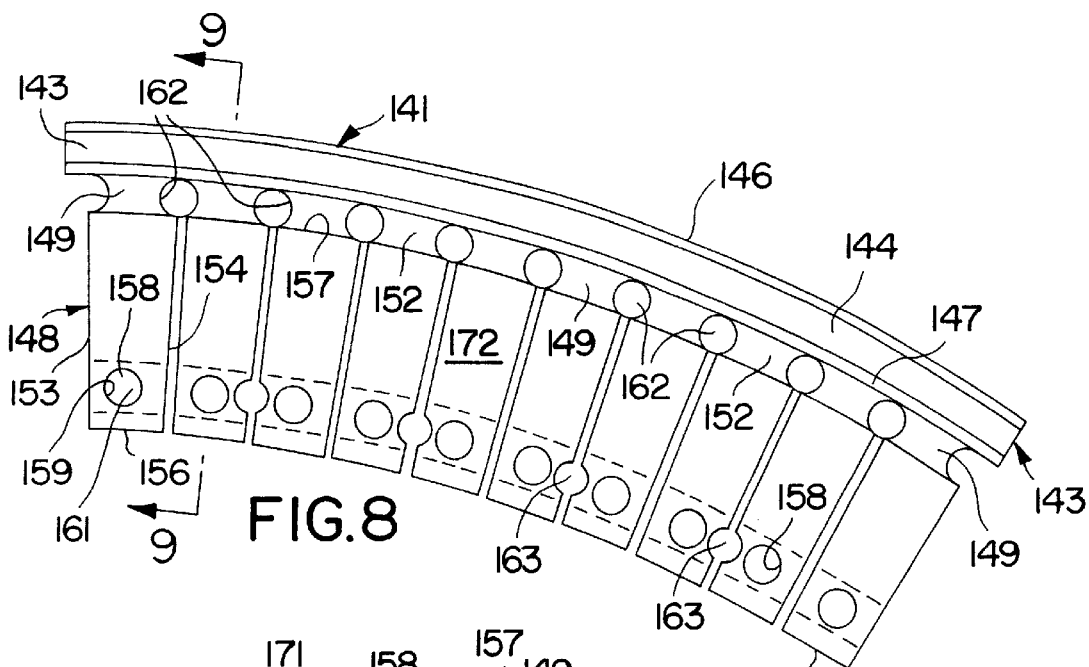
FIG. 8 is an enlarged top plan view of a wafer peripheral edge gripping means shown apart from other structure.
Figure 9:
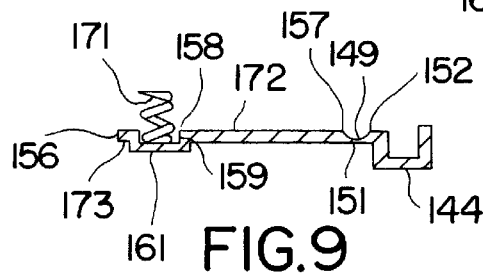
FIG. 9 is a vertical cross-sectional view taken in the plane indicated by the line 9–9 in FIG. 8.
Figure 10:
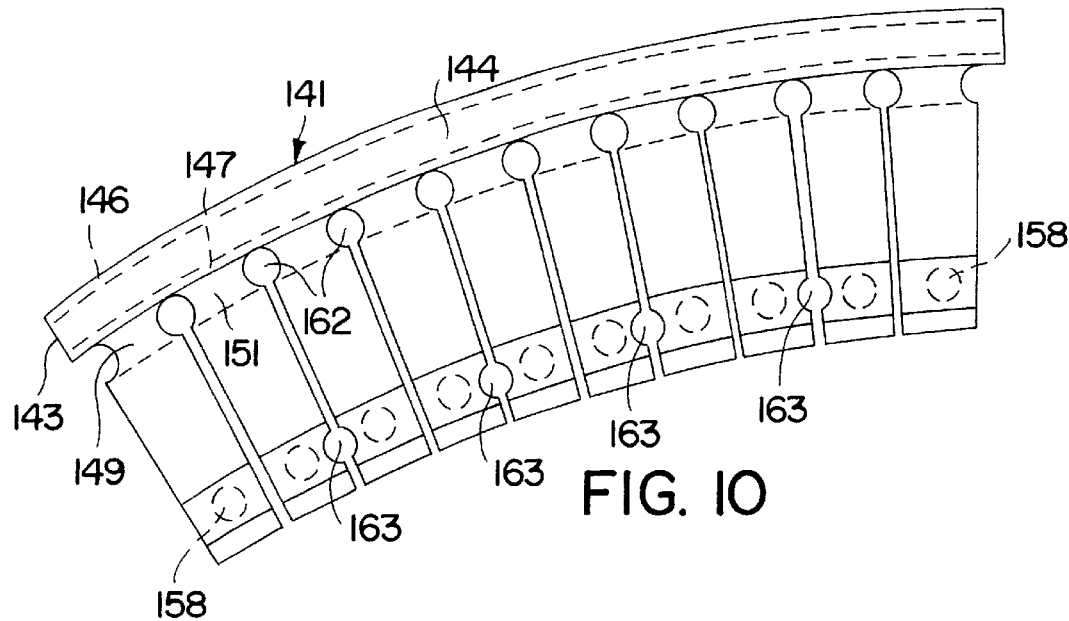
FIG. 10 is an enlarged bottom plan view of the wafer peripheral edge gripping means illustrated in FIG. 8 and shown apart from other structure.

Referring to FIGS. 8, 9 and 10, it will be seen that each clamping device 141 and 142 is arcuate in its configuration, each spanning an arc of approximately 31° and including a channel-shaped edge portion designated generally by the numeral 143. The channel 143 is formed with a bottom wall 144, a first side wall 146 and a second side wall 147. The two side walls are arcuate and spaced sufficiently that when deposited over a bladder as illustrated in FIG. 7, the channel slips snugly into the arcuate space between the inner edges 101 and 102, as the case may be, and the corresponding associated rib 108 and 109, each wafer-clamping device thus being detachably retained from inadvertent displacement in any direction.

Integrally attached to the second side wall 147 of each of the wafer-clamping devices are a series of ten radially-extending beams, each designated generally by the numeral 148. While ten wafer-clamping beams are illustrated, it should be understood that the quantity will vary with end-effectors of different sizes. The beams 148 are each integrally attached to the associated second side wall 147 by a flexible or "live" hinge 149 which comprises a narrowed section of the beam having a flat backside 151 (FIGS. 9 and 10) and a curved top or front side 152 in the form of a groove having an arcuate bottom as seen in FIGS. 8 and 9. From the narrowed down flexible "live" hinge portion 149, each beam extends radially away from the hinge portion and is tapered approximately 3° along its longitudinal edges 153 and 154, converging toward an end edge 156 that is narrower than the portion 157 that is integral with the "live" hinge 149. Additionally, it should be noted that the beams are spaced apart approximately 0.031" so that each of the beams may be independently displaced without affecting the displacement of the adjacent beams.

Adjacent its end edge 156, each of the beams is provided with a recess 158 formed by cylindrical walls 159 closed by a bottom wall 161. Additionally, to enhance the flexibility of the "live" hinges 149, there are provided through-holes 162 spaced typically 3° apart and thus shortening the length of the arcuate narrowed flexible "live" hinge portion 149 that integrally yet flexibly attaches each of the beams to the associated second flange 147 of channel member 143. Thus, collectively, the ten side-by-side beams 148 all lying generally in the same plane, subtend an arcuate angle of approximately 31°, with the radial dimension of each of the wafer-clamping devices being approximately 1.150" and the length of each individual beam, measured from the second flange 147 to the end edge 156 being approximately 0.950". The through-holes 162 are conveniently approximately 0.125" in diameter, while the recesses 158 formed adjacent the end edges 156 of the beams are also conveniently approximately 0.125" in diameter having cylindrical walls approximately 0.070" deep.

From FIGS. 8 and 10, it will be seen that between the second and third beams 148, counting from the left in FIGS. 8 and 10, and between the fourth and fifth, and between the sixth and seventh, and between the eighth and ninth beams, there are provided in the adjacent edges of these beams confronting half-circle recesses which define a series of four apertures 163 that are spaced apart and which coincide with the positions of the four bored studs 93 illustrated in FIG. 4, which studs project into the apertures 163 when the wafer-clamping devices are superimposed over the bladders as illustrated in FIG. 7.

Referring to FIGS. 7, 8, 9, 11 and 12, it should be noted that the recesses 158 formed in the distal end portions of the beams 148 each accommodates a coiled compression spring 171 that slips loosely into the recess and which has a length sufficient that after insertion into the accommodating recess the top end of the spring projects above the top level or upper surface 172 of the beam on which the spring is supported. Since there are two sets of ten beams 148, there are of course twenty springs, one for each beam. As a consequence, when the top plate is superimposed over and detachably secured to the bottom plate with the coiled compression springs in position, the top ends of the springs come to bear upon the undersurfaces 32 and 33 of the top plate shown in FIG. 3. The downwardly projecting bored studs 88 in the top plate are axially aligned with the threaded studs 93 on the bottom plate, thus binding the top plate to the bottom plate and capturing the springs.

As a consequence of the elastic resilient force imposed upwardly on the top plate by each of the multiplicity of coiled compression springs, it is seen in FIG. 12 that an equal downward force is imposed by each spring on its associated beam, and each beam 148 is caused by such downwardly directed force to flex downwardly, separating the distal end portion of the beam from the associated inner surface of the top plate and, in the absence of an intervening wafer, bringing the bottom surface 161 of each of the beams adjacent its free end edge 156 into impinging contact with the inner surfaces of the recesses 98 and 99 formed in the bottom plate.

Since this relationship of the parts exists in the absence of a wafer when the bladders are deflated, it follows, as illustrated in FIGS. 11 and 12, that when a wafer is in place the very narrow flat surface portion 173 adjacent the end edge 156 of each beam is pressed tightly against the top surface of the wafer in the narrow arcuate band or "free-zone" that surrounds the "non-intrusion" area of the wafer when a wafer is in proper position. Such pressure on the top "free-zone" surface of the wafer causes the complementary bottom arcuate edge portion of the wafer to be pressed tightly against the very narrow flat surface 174 of the bottom plate, as illustrated in FIG. 12. Thus, when a wafer intervenes and is gripped by each beam, the bottom wall 161 of the beam does not impinge on the inner surface of the bottom plate.

It will thus be understood that the "free-zone" of the wafer is tightly gripped between the multiplicity of downwardly pressing beams 148 and the flat narrow arcuate surface of the bottom plate that lies adjacent the chamfered area of the bottom plate 86. In this embodiment, FIGS. 11 and 12, the wafer is gripped in a fail-safe manner that prevents inadvertent release of the wafer, thus preserving its integrity and obviating the financial loss that would occur if the wafer were to be inadvertently released and fall from the end-effector.

To free the wafer from the fail-safe gripping action end-effector as illustrated in FIG. 12, reference is made to FIG. 11 where it is seen that the bladders 133/134, interposed between the bottom plate surfaces 106 and 107 and the underside of the two sets of wafer-clamping devices 141, when inflated by the admission of an appropriate fluid such as nitrogen through the aperture 96 and into the bladders, causes the bladders to expand and, as shown in FIG. 11, elevate the beams 148 against the pressure exerted on them by the springs 171. As shown, the springs are compressed, and the end portion 173 of each of the beams is lifted and disengaged from the "free-zone" 7 of the wafer, thus releasing the wafer for appropriate storage in a rack (not shown) or transferred to another processing station for further fabrication procedures or testing.

Since the gripping action of the wafer by the end-effector occurs automatically by virtue of the pressure exerted by the springs 171, and since it is highly unlikely that the bladders would, inadvertently, be inflated, it follows that this embodiment discloses and describes a fail-safe end-effector device for grasping and manipulating a wafer in a non-contaminating manner. It should also be noted that the terms "up", "down" and "lifted" are relative terms and that the clamp as illustrated in FIGS. 11 and 12 is working down relative to the confronting abutment surface 174 but may also be configured to work upwardly or laterally in relation to an abutment surface.

Figure 13:
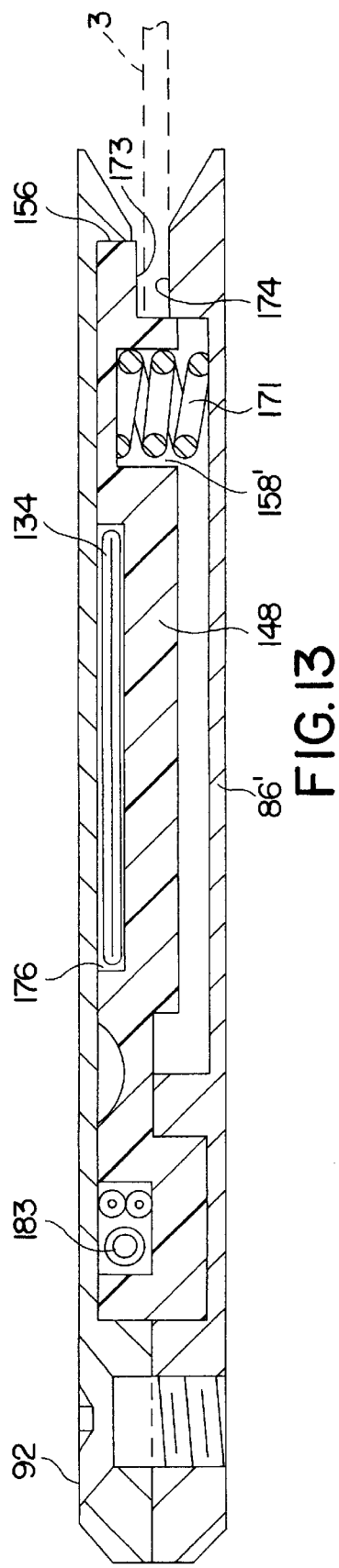
FIG. 13 is an enlarged vertical cross-sectional view taken in the same plane as FIG. 11 but illustrating a spring pressure activated normally open end-effector device in which the deflated but selectively inflatable bladder is positioned to effect clamping closure of the end-effector jaws upon the arcuate peripheral edge "free-zone" area of the wafer when the bladder is inflated and release therefrom when the bladder is deflated as shown.

FIGS. 13 and 14 illustrate a second embodiment of the invention in which the bladders must be inflated or pressurized (FIG. 14) to effect gripping of the wafer, with consequent release of the wafer when the bladders are deflated (FIG. 13). It will of course be understood that this is a mode of operation that is essentially the reverse of the mode of operation of the embodiment illustrated in FIGS. 11 and 12. To effect this result, in this second embodiment, the springs 171 are interposed between the bottom plate and the underside of the beams 148, while the bladders are interposed between the top plate and the top surfaces of the beams. Thus, as shown in FIG. 13, deflating the bladders causes the springs 171 to flex the beams upwardly, thus disengaging the flat surface 173 of each beam from the "free-zone" of the associated wafer and thus releasing the wafer to a storage rack or to another processing station.

On the other hand, when it is desired to grip a wafer with the end-effector of this embodiment, as shown in FIG. 14, the bladders are inflated by an appropriate fluid such as nitrogen under appropriate pressure and control, causing the distal end portions of the beams 148 to be flexed downwardly against the elastic resilience of the springs 171, resulting in the springs being compressed as shown, and bringing the undersurface 173 of each beam independently into gripping contact with an arcuate portion of the "free-zone" of the wafer surrounding the "non-intrusion" area of the wafer. It should be noted that this mode of operation, while using positive pressure rather than negative pressure or vacuum, equates with the conventional "standard" vacuum-operated end-effector devices in that if the pressure-generating system in this embodiment fails for any reason, the wafer will be released by the end-effector in the same way that it will be released by a "standard" vacuum-operated surface-clamping end-effector of current technology should the vacuum system fail for any reason. Despite this similarity, one advantage of this pressure operated end-effector is that it eliminates the possibility of contamination of the wafer since its only contact with the wafer is with the "free-zone" surrounding the "non-intrusion" area of the top surface of the wafer and a very narrow peripheral arcuate band of approximately 31° on the underside of the wafer. A second advantage is that the holding force is unlimited and at a minimum is three times (3x) that of the conventional technology.

From a structural point of view, it will be noted from FIGS. 13 and 14 that the exterior configuration of the top and bottom plates is the same as in FIGS. 1 and 2, but some changes have been incorporated into the interior of the bottom plate. Thus, with respect to the bottom plate 86', the elevated areas 106 and 107 seen clearly in FIG. 4 are omitted in this embodiment, and the beams are provided with notch 176 in their top surfaces to accommodate the placement of the bladders 133 and 134, only bladder 134 being shown in these cross-sectional views. Additionally, the recess 158' in each beam adjacent the end edge 156 is formed in the bottom surface of the beam instead of the top surface so that the springs 171 may be accommodated between the undersides of the beams and the bottom surfaces of the recesses 98 and 99 of the bottom plate.

Means are provided on the end-effectors of the first and second embodiments of the invention described above to ensure that the wafer "free-zone" 7 is properly positioned with respect to the gripping surfaces 173 of the beams 148 and the complementary arcuate gripping band 174 of the bottom plate as a condition precedent to the deflation of the bladders in the embodiment of FIGS. 11 and 12, and as a condition precedent to the inflation of the bladders in the embodiment illustrated in FIGS. 13 and 14.

Referring to FIGS. 3 and 7, it will be noted that the recesses 74 and 76 formed in the underside of the top plate as seen in FIG. 3 confront similar recesses 74' and 76' formed in a corresponding location on the interior of the bottom plate. It should be borne in mind that the top plate as viewed in FIG. 3 is inverted and that when it is superimposed "right-side-up" over the bottom plate the recesses 74/74' and 76/76' will be in a confronting relationship. In like manner, the recess 44 formed in the beam 34 of the top plate corresponds in location and dimension to the recess 44' formed in the beam 113 in the bottom plate as seen in FIG. 4. Passageways 81 and 82 communicate with the recesses 76/76' and 74/74' and a passageway 83 communicates with the interior of the recess 44 formed in the beam 34. Micro-switch devices 176, 177 and 178 are enclosed within these recesses as illustrated in FIG. 1, and these are connected by appropriate electrical or electronic leads 181, 182 that pass from channels 72 and 73 through the channel 143 (FIG. 7) and emerge through the apertures 53 and 54 in the top plate (FIG. 4) to be connected to a source of power and robotics. A fiber optic bundle 183 (FIGS. 11–14) passes through the passageways 77/77' and 78/78' shown in FIGS. 3–5 and 7 and also continues through the channel 43 formed on each wafer-gripping device as illustrated in FIGS. 7 and 11–13.

These micro-switches 176, 177 and 178 include plungers that are slidably mounted in passageways 81/81', 82/82' and 83/83' and each switch is appropriately connected to a power source and activated when the peripheral edge of the wafer is properly positioned within the end-effector gripping means and depresses the plunger. The fiber optic bundles 183 lead to optical type sensors mounted in the passageways 77 and 78 that "see" and determine when the wafer is present. When present, the switches check to confirm that the wafer is properly seated in the end-effector. In both instances, the leads from the micro-switches and sensing devices terminate in enunciators that indicate either wafer presence or by the illumination of appropriate illuminated signals when the end-effector and wafer are properly related for activation of the wafer-gripping means. Such activation may be carried out automatically by computer-controlled robotic equipment to which the end-effector is connected by means of an appropriate connector terminal mounted on the bracket designated generally by the numeral 184 and illustrated in FIGS. 1, 15 and 16.

Such computer-controlled robotic equipment is conventionally used in the industry and is not part of the invention described and illustrated herein. However, the bracket herein illustrated and described is provided to enable connection of the end-effector of this invention to conventional robotic equipment, thus facilitating implementation of the end-effector of the present invention with conventional robotic equipment already in place in wafer handling equipment. As seen in FIGS. 15 and 16, the bracket 184 comprises two bifurcated opposite end portions designated generally by the numerals 186 and 187. The larger bifurcated end portion 186 includes a bottom plate 188 spaced from and parallel to an upper plate 189. A through-bore 191 is provided in the geometric center of the bottom plate 188 for connection to a source of gas under pressure or to a vacuum supply.

Figure 17:
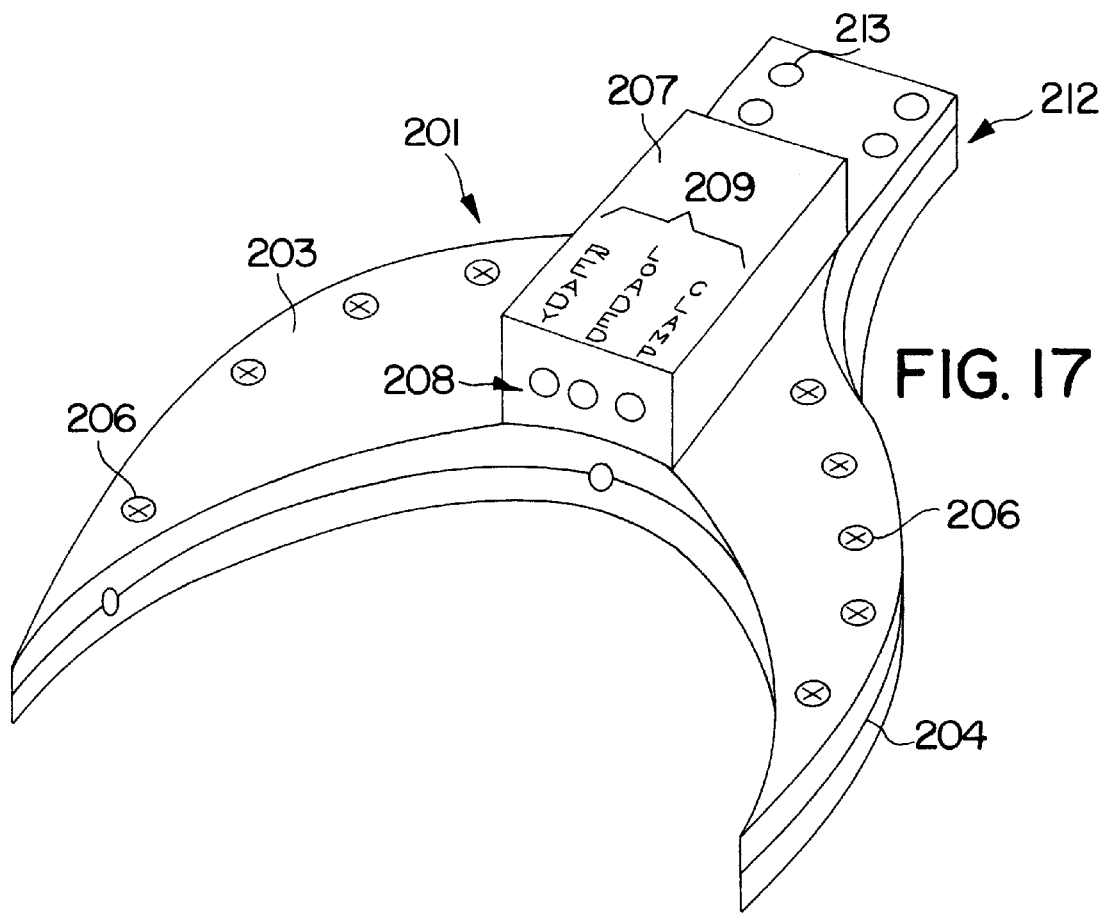
FIG. 17 is a perspective view illustrating in general the configuration of a third embodiment wafer "free-zone" gripping and vacuum-driven fail-safe end-effector.
Figure 18:
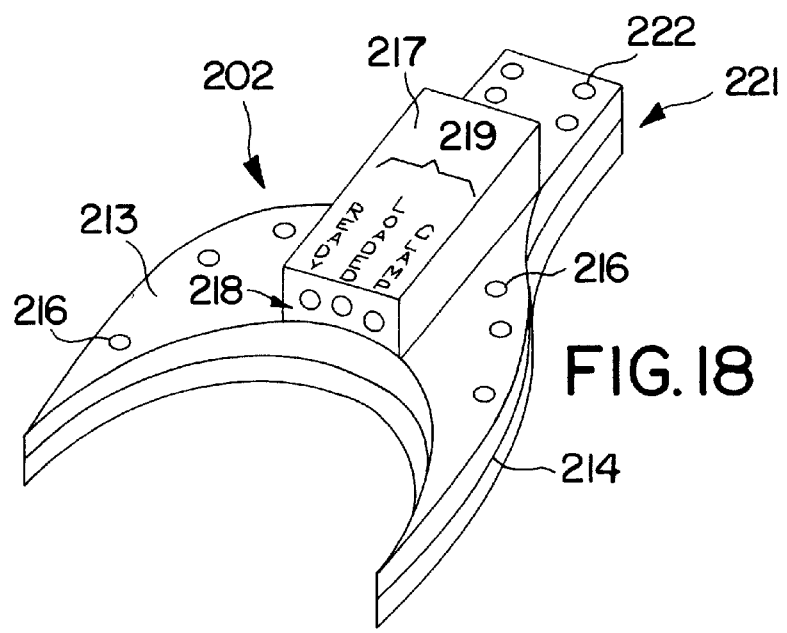
FIG. 18 is a perspective view similar to FIG. 17 of a fourth embodiment wafer "fee-zone" gripping and vacuum-driven "standard", i.e., non-fail-safe end-effector.

Third and fourth embodiments of the invention are illustrated in FIGS. 17 and 18 and include in FIG. 17 a perspective view of a fail-safe end-effector and in FIG. 18 an end-effector designated generally by the numeral 202 that is not fail-safe and instead is designated as a "standard" end-effector in that it is readily applicable to existing vacuum systems that are used by conventional end-effectors. These two embodiments of the invention are similar to the end-effectors in the sense that they include gripping means that reliably grip the "free-zone" that surrounds the "non-intrusion" area of the integrated circuit wafer that is sensitive to contamination. Referring to FIG. 17, it will be noted that this fail-safe end-effector 201 is similar to the end-effectors described above in that it includes a top plate 203, a bottom plate 204, the top plate 203 being superposed over the bottom plate 204 and secured thereto by appropriate machine screws 206. Mounted on the top plate is an indicator box 207 having three signal lights designated generally by the numeral 208, the first light when illuminated indicating that the end-effector is ready to accept a wafer, the second light when illuminated indicating that the wafer is loaded into the end-effector, and properly positioned therein, while the third light when illuminated indicates that the end-effector has been clamped onto the wafer. These functions are indicated by appropriate indicia 209 printed on the top surface of the indicator box. To enable mounting of the end-effector in robotic equipment, the end-effector is provided with a rearwardly extending mounting portion designated generally by the numeral 212 provided with appropriate apertures 213 to which the adaptor bracket illustrated in FIGS. 15 and 16 may be attached. It should be understood that while the indicator box 207 is illustrated and its function explained herein, it is not an essential element of the combination, but is preferred when the end-effectors disclosed herein are robotically controlled.

In like manner, and referring to FIG. 18, which depicts the "standard" non-fail-safe type of edge gripping end-effector illustrated in FIGS. 13 and 14, it, too, is provided with an upper plate 213, a lower plate 214, the plate 213 being superimposed over the plate 214 and secured thereto by appropriate screws 216. Mounted on the top plate 213 is a signal box 217 provided with a group of three lights 218, the first of which, when illuminated indicates that the end-effector is ready to receive a wafer, the second light being illuminated to indicate that the wafer is properly loaded and positioned, while the third light when illuminated indicates that the end-effector has clamped onto the "free-zone" of the wafer. These functions are indicated by appropriate indicia designated by the numeral 219. As with the end-effector illustrated in FIG. 17, the end-effector of FIG. 18 is also provided with a rearward extension designated generally by the numeral 221 having mounting bores 222 for detachable attachment of the mounting bracket or adaptor illustrated in FIGS. 15 and 16 which facilitates connection of the end-effectors illustrated in FIGS. 17 and 18 to appropriate robotic equipment.

Figure 19:
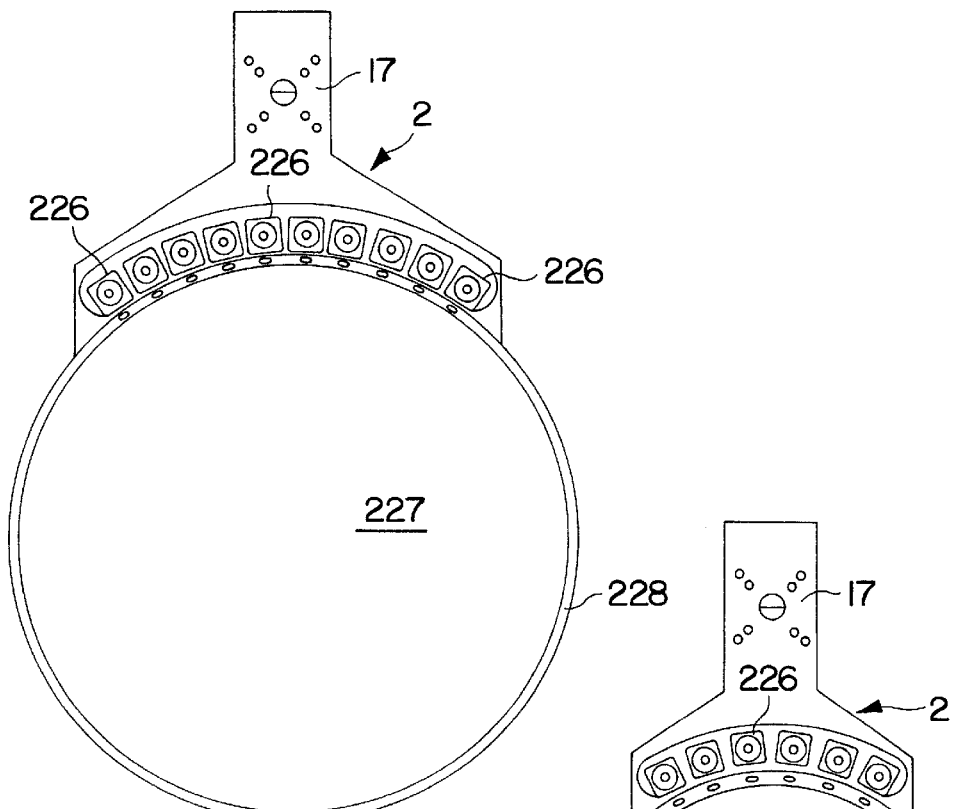
FIG. 19 is a diagrammatic plan view of the bottom plate of the end-effector illustrated in FIG. 17, showing the relationship of a number of the individual clamps that are vacuum-driven to grip the wafer "free-zone" in a fail-safe or "standard" non-fail-safe manner.

As previously described, the end-effectors of this invention are designed to reliably grip the "free-zone" on the peripheral annular portion of a wafer that surrounds the "non-inclusion" portion of the wafer. Since there are different diameters of wafers, generally four inches, six inches, eight inches and twelve inches, the end-effectors of this invention are constructed to accommodate the different diameters of wafers by providing an adequate number of gripping beams for the various wafer sizes. Thus, referring to FIGS. 19 through 21, inclusive, it will be noted that the end-effector illustrated diagrammatically in FIG. 19 is provided symbolically with ten separate wafer clamping or gripping devices or assemblies arranged in an arcuate pattern corresponding to the peripheral arc of the wafer that they are intended to grip. More or fewer wafer clamping devices could be used under appropriate circumstances. In the interest of brevity in this description, each of the wafer gripping assemblies is designated generally by the numeral 226 and it is noted that each is mounted on the bottom plate of the end-effector and is shown in a mounted relationship on a wafer designated generally by the numeral 227. As described above in connection with other embodiments, the wafer 227 is provided with an annular "free-zone" 228 that measures approximately 0.080" radially inwardly from the outer periphery of the wafer, such "free-zone" being the area on the top surface of the wafer that is grasped by the individual gripping assemblies 226 when the end-effector is clamped onto the wafer.

Figure 20:
FIG. 20 is a view similar to FIG. 19, but illustrating a lesser number of wafer-gripping clamps associated with the "free-zone" of a smaller diameter wafer.

With respect to the end-effector illustrated in FIG. 20, it is noted that in this case the end-effector is applied to a wafer 299 that is nominally eight inches in diameter, thus requiring a shorter include angle to accommodate sufficient gripping or clamping assemblies 226 to adequately grip and reliably support the smaller diameter wafer. As indicated in FIG. 20, this size end-effector symbolically utilizes six of the individual wafer gripping assemblies, again arranged in an arcuate pattern as illustrated.

Figure 21:
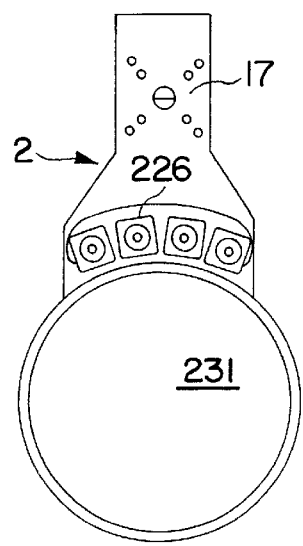
FIG. 21 is a view similar to FIG. 19, but illustrating a lesser number of wafer-gripping clamps associated with the "free-zone" of a still smaller wafer.

Referring to FIG. 21, it will be noted that in this case, the end-effector again has been reduced in size to accommodate the reduction in size of the nominally six inch diameter wafer 231 by application symbolically of only four independent wafer gripping assemblies 226. It should be understood that the independent gripping assemblies 226 are mounted on the bottom plate of the end-effector as illustrated, and that the end-effector and the included gripping assemblies 226 are arranged so as to receive and grip the peripheral annular "free-zone" edge portion of the wafer in a reliable manner.

Figure 22:
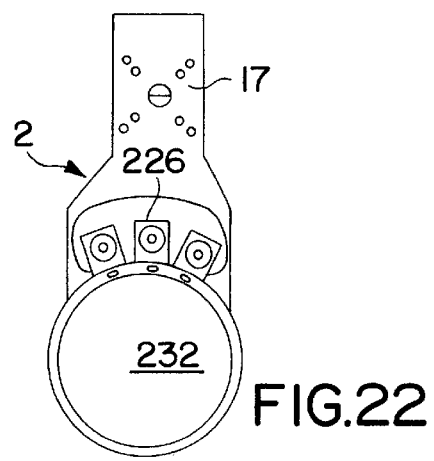
FIG. 22 is a view similar to FIG. 19, but illustrating only three wafer-gripping clamps associated with the "free-zone" of a still smaller wafer.

Referring to FIG. 22, it will here be seen that the wafer 232 is nominally a four inch diameter wafer and that it is attached to the end-effector by the gripping action provided symbolically by three cooperatively associated gripping or clamping assemblies 226 mounted on the bottom plate of the end-effector.

Figure 23:
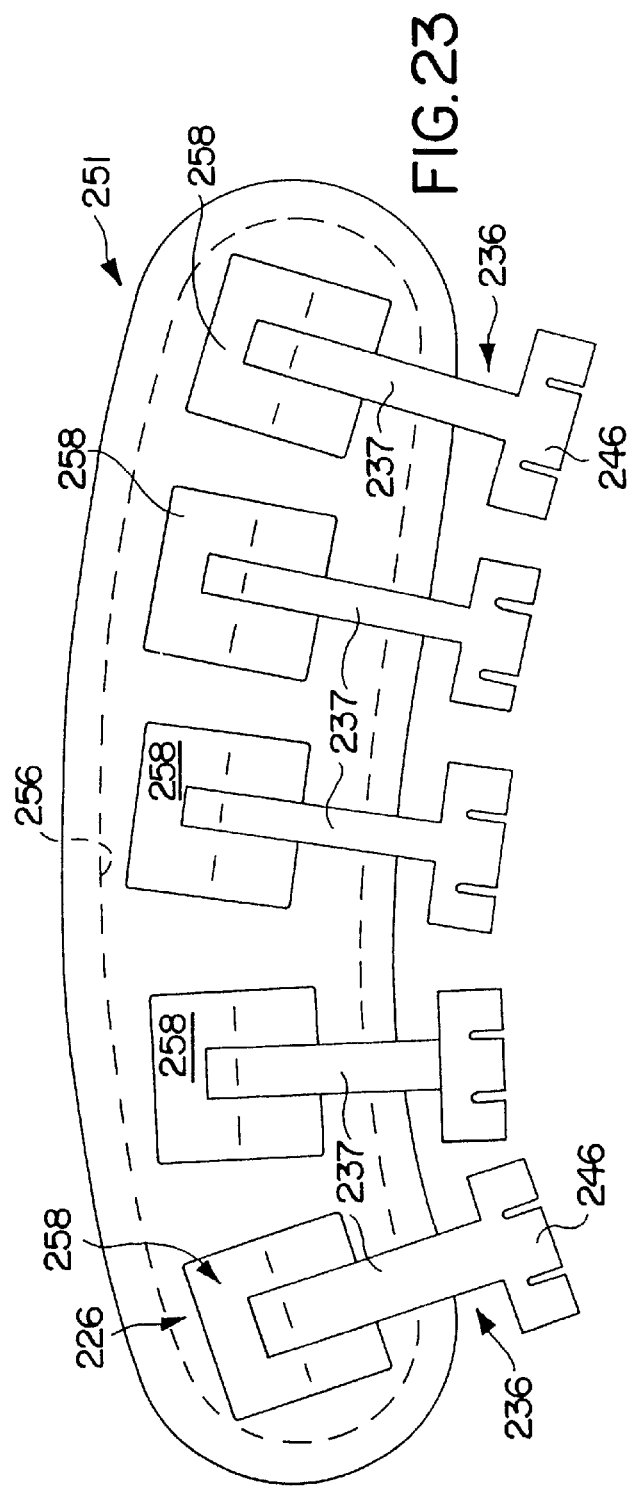
FIG. 23 is a diagrammatic view of the diaphragm and normally-closed wafer-gripping clamps shown apart from other structure for clarity, and showing the clamps in a normally closed fail-safe arrangement.

Referring to FIGS. 23 and 33, it will be seen that the internal construction of each of the end-effectors incorporates the gripping assemblies in such a manner that a given end-effector may be normally closed and opened by the application of vacuum or negative pressure to the end-effector, thus operating in a "fail-safe" mode, (FIGS. 24 and 31), or they may be arranged in a normally open configuration wherein a vacuum or negative pressure must be applied to the end-effector to effect gripping operation of each of the gripping assemblies as seen in FIGS. 32 and 33, thus operating in a non-fail-safe mode.

Referring to FIGS. 25 through 30, the detailed construction of each of the wafer gripping assemblies, including the various components that make up the assembly, are illustrated as separate components, and as exploded views illustrating the positional relationships of the components one to the other. Thus, referring to FIGS. 25 and 26, each of the gripping assemblies 226 includes a clamp arm designated generally by the numeral 236 and comprises a generally T-shaped structure including a stem portion 237 formed integrally with the cross-bar designated generally by the numeral 238. This component 236 is preferably fabricated from metal, the stem 237 having transversely extending thickened portion 239 and 241 as illustrated in FIG. 26, to accommodate transversely extending bores 242 and 243 for a purpose which will hereinafter be explained. The cross-bar 38 is provided with slots 244 generally evenly spaced across the length of the bar 238 to provide four segments 246 that are integral with the cross-bar 238 as shown, and which penetrate the cross-bar for a distance of approximately 0.100" which is approximately one-half the width of the cross-bar 238. It should also be noted that the edges 247 of the cross-bar are arranged in an arcuate pattern that corresponds to the arcuate curvature of the wafer that the clamping component is adapted to engage. Thus, if the clamp member 236 is adapted to clamp onto the peripheral "free-zone" of a nominally twelve inch diameter wafer, the curvature of the edges 247 of the cross-bar would have a radius dimension of approximately 5.906". Obviously, this radius dimension will vary depending on the size of the wafers to be gripped by the clamp member.

To provide a proper perspective of the size of the clamp member 236, it is noted that the stem member 237 of a clamp member adapted to grip the peripheral "free-zone" of a nominally twelve inch diameter wafer is only 0.250" wide. The overall length of the clamp member 236 amounts to only approximately 1.06"and possesses a thickness of only 0.30" while the nominal width of the cross-bar 38 is approximately 0.180". The through bores 242 and 243, for instance, are only 0.032" in diameter. Obviously, the dimensions noted are by way of example, and different dimensions could be used, particularly with different size wafers.

Figure 24:
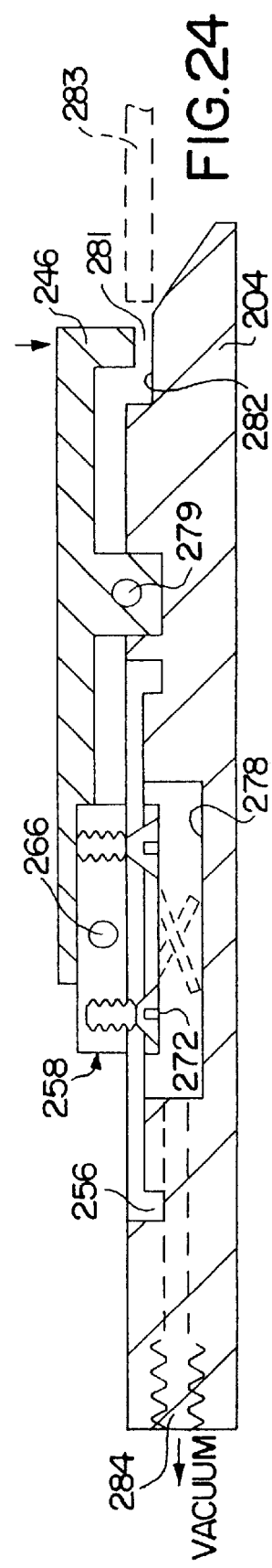
FIG. 24 is a diagrammatic vertical cross-sectional view illustrating the diaphragm and a normally-closed wafer-gripping clamp mounted on the bottom plate of an end-effector shown apart from the top plate.
Figure 29:
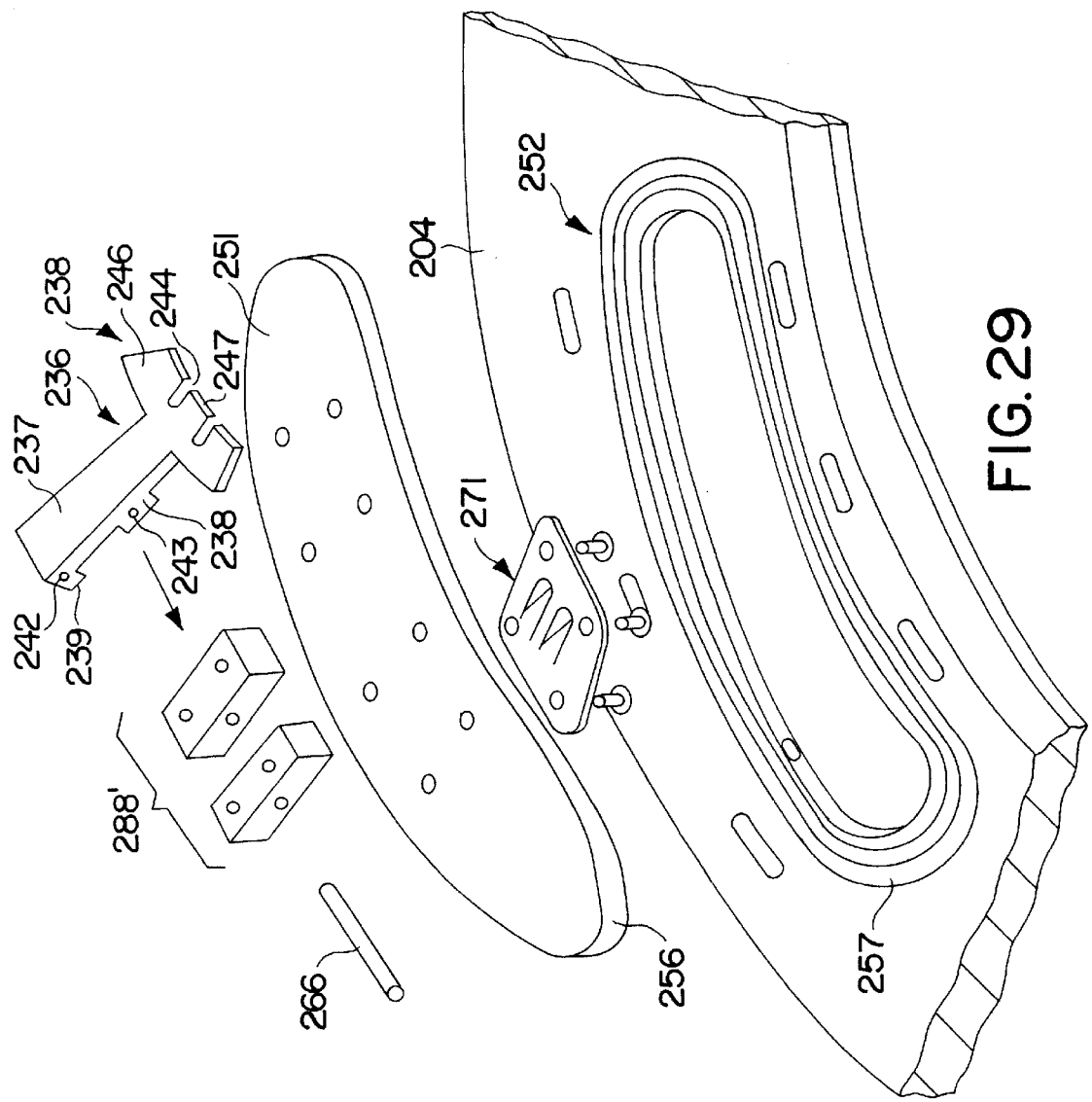
FIG. 29 is a perspective view shown in exploded form and illustrating the positional relationships of the diaphragm, the mounting piston, the spring plate and a normally-closed or normally-open wafer-gripping clamp with a portion of the bottom plate of the fail-safe or "standard" end-effector.
Figure 34:
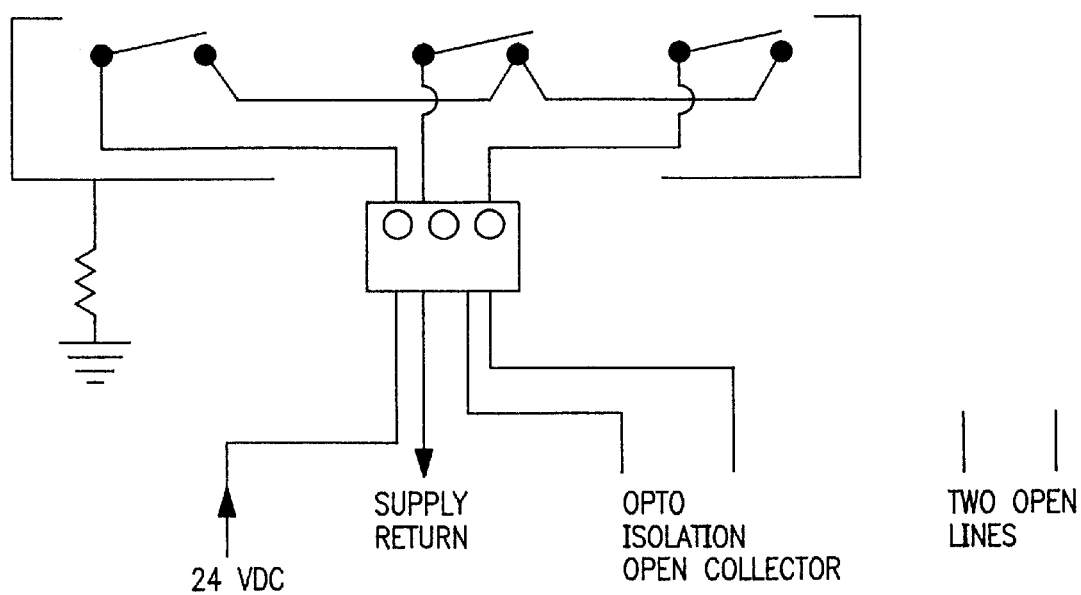
FIG. 34 is a diagrammatic view of the three normally-open single pole switching assembly that provides positioning data to the logic circuit which in turn controls the LEDs that indicate functional conditions on the end-effector.
Figure 35A:
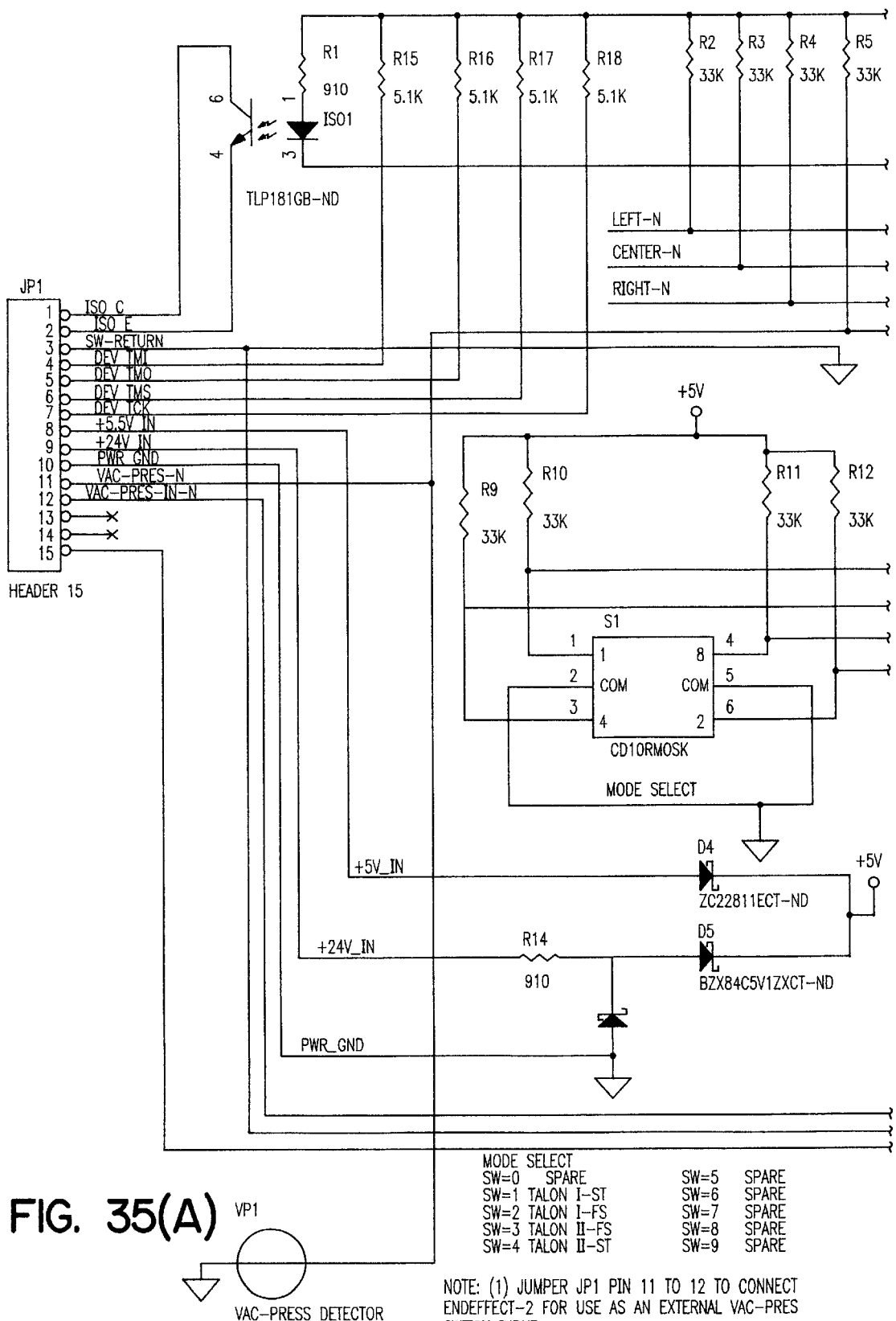
Figure 35B:
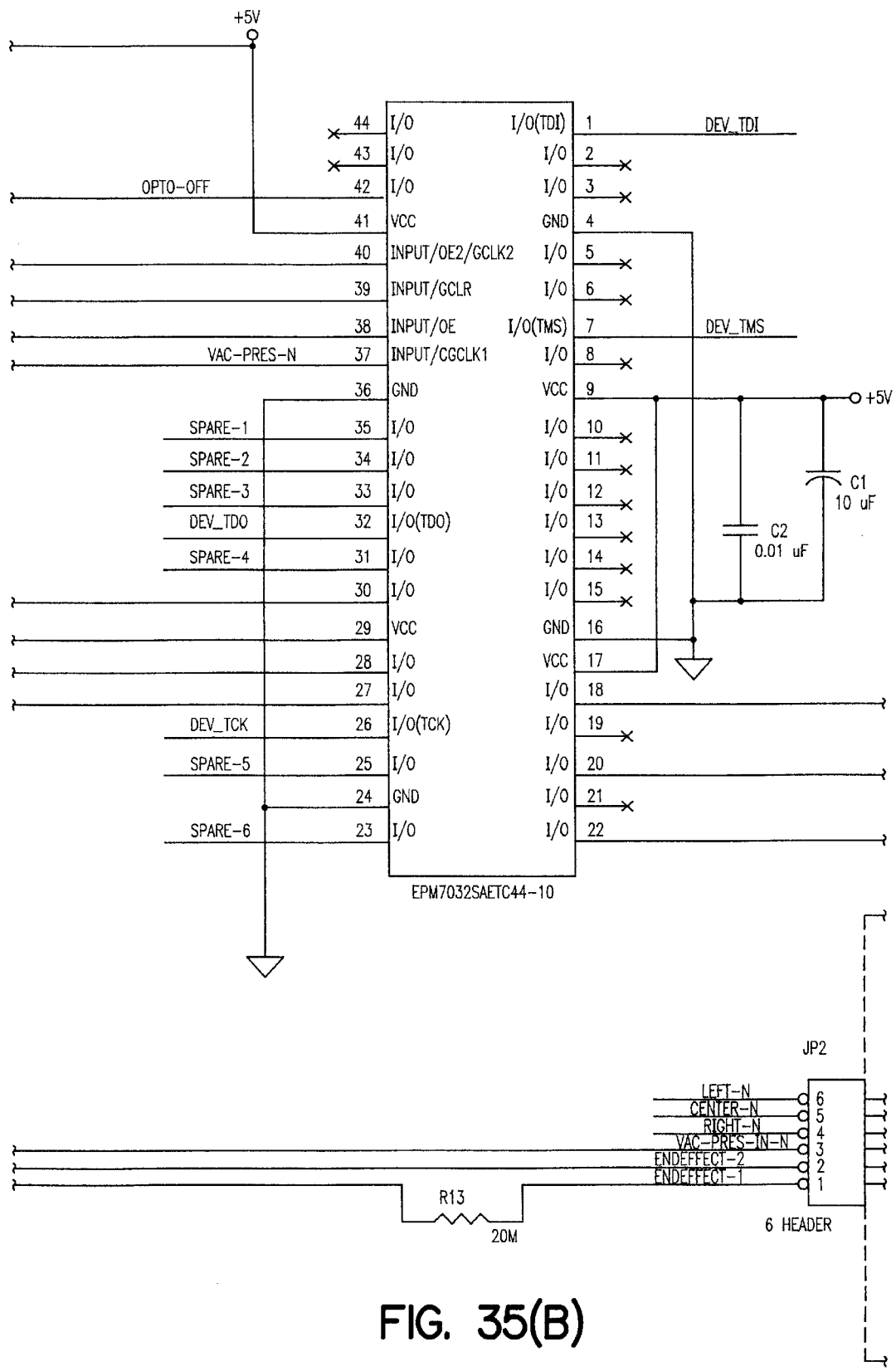

Referring to FIG. 23, it will be noted that the clamp members designated generally by the numeral 236 are associated with a diaphragm designated generally by the numeral 251 having an arcuate configuration as illustrated, to fit the conformation of a recess designated generally by the numeral 252 (FIG. 29) formed in the bottom plate 204 of the end-effector 201. As illustrated in FIGS. 23 and 29, the diaphragm 251 is provided with a downwardly projecting peripheral rim 256 configured and having a depth sufficient to project into an arcuate groove 257 formed in the bottom plate 204. the wafer clamp assemblies 226 in one embodiment include a monolithic mounting plate or piston 258 as illustrated in FIGS. 27 and 27(A). This monolithic mounting plate or piston is essentially square, being only 0.6" on each side and having a thickness of approximately 0.060". Formed in the top surface of the piston 258 and extending transversely thereof from the left side to the right side as indicated in FIG. 27, is a groove 259 having a depth of approximately 0.050", thus leaving a bottom wall portion 261 having a thickness of only approximately 0.010". Formed in the bottom wall 261, as illustrated in FIG. 27, is a generally rectangular aperture 262 adapted in one embodiment as illustrated in FIGS. 24 and 26 to receive the end projection 239 formed on the stem-portion 237 of the clamp member 236. When properly positioned in the aperture 262, the through-bore 242 in the projection 239 is in axial alignment with through-bores 263 and 264 formed in the piston 258 as illustrated. Thus positioned, the pin 266 illustrated in FIG. 29 is inserted through the bores 263 and 264 and through the bore 242 in the clamp member 236 to pivotally mount the clamp member 236 on the piston 258. Additionally, the piston 258 is provided with threaded mounting bores 267 for a purpose which will hereinafter be explained.

As illustrated in FIG. 24 and FIGS. 30–31, where a vertical cross-section of the bottom plate 204 is illustrated, the diaphragm 251 is sealingly secured to the upper surface of the bottom plate 204 by placement of the superposed top plate which presses the peripheral flange 256 of the diaphragm into a receptive groove in the bottom plate. Each piston 258 for receiving each clamp arm or beam 236 is mounted centrally between the longitudinal edges of the diaphragm and are spaced apart as shown in FIG. 23. To mount the piston 258 on the diaphragm, a spring plate designated generally by the numeral 271 and illustrated in FIGS. 28 and 28(A) is attached to the underside of the diaphragm 251 as shown in FIG. 24, and attached thereto by machine screws 272 that pass upwardly through appropriate apertures 273 formed in the spring plate 271 as shown best in FIG. 28(A). The spring plate 271 is provided with two downwardly projecting resiliently flexible tongue-like members or tangs 274 that are spaced apart from a third similar tang 276. The tangs 274 are integral with the plate at their base ends and are displaced downwardly as seen in FIGS. 24 and 28(A) so that the end portions 277 of the tangs 274 abut the bottom interior surface 278 of the bottom plate 204 as seen in FIG. 24. In like manner, the tang 276 which lies between the tangs 274 but which extends in the opposite direction, has an end portion 279 which also abuts against the surface 278 of the bottom plate.

It will thus be seen that mounted as illustrated in FIG. 24 and FIGS. 30–33, the elastic resilience of the tangs 274 and 276 has the effect of biasing the diaphragm 251 upwardly below each piston 258, causing the pin 266 to also be elevated, carrying with it the end portion 239 of the clamp stem 237, thus causing the clamp member 236 to pivot clockwise about the pivot pin 279 (FIG. 24) so that the end portions 246 of each beam 236 normally move downwardly in the direction of the arrow, to close the gap 281 between the undersides of the members 246 and the top surface 282 of the bottom plate in the absence of a wafer 283 but which space 281 may be enlarged to permit entrance of the wafer "free-zone" peripheral portion when a vacuum is applied to the end-effector through the port 284.

Thus, when the port 284 is connected to a source of vacuum, the reduced pressure within the recess below the diaphragm 251 causes the diaphragm to be drawn downwardly against the resilient tension in the tangs 274 and 276, causing the piston 258 to move downwardly, carrying then pin 266 downwardly, and thus causing the clamp arm 236 to pivot counterclockwise, thus raising the grip end 246 of each clamp member 236 so as to open the gap 281 and permit the peripheral "free-zone" of the wafer to penetrate into the end-effector. It is for this reason that the embodiment of the invention illustrated in FIG. 24 is considered to a fail-safe embodiment. Since the vacuum system is used only momentarily to effect opening of the end-effector to admit the wafer, which vacuum is immediately discontinued once the wafer is properly positioned in the end-effector, the spring plate 271 automatically elevates the diaphragm and causes the clamp member 236 to clampdown tightly on the peripheral edge portion of the wafer.

It will be understood that under these conditions, the wafer will be held indefinitely gripped between the bottom surface of the clamp portion 246 and the top surface 282 of the bottom plate by the continued pressure exerted by the spring plate 271 against the underside of the diaphragm 251. It requires activation of the vacuum system to break the grip of the end-effector on the wafer. For greater clarity, the structure illustrated in FIG. 24 is shown in exploded form in FIG. 30 and corresponding reference numbers have been applied to corresponding parts of the structure.

Referring to FIG. 31, it will be seen that this same embodiment of the invention, i.e., a normally-closed fail-safe end-effector that is opened by the application of vacuum pressure is illustrated with only slightly different components. In this embodiment illustrated in FIG. 31, the mode of operation is essentially the same as previously discussed, i.e., a normally-closed mode of operation that requires the application of negative or vacuum pressure to the interior of the end-effector shell to open the end-effector and release the wafer. Without the application of negative pressure, the end-effector remains tightly and reliably gripped to the peripheral "free-zone" of the wafer so that the wafer cannot be inadvertently released from the end-effector. In this view it will be seen that the top plate 203 is superimposed over the bottom plate 204 and secured by the screws 206 (FIGS. 17 and 18) to capture the diaphragm between the top plate 203 and the bottom plate 204 as previously described and illustrated. Superposition of the top plate Causes it to impinge on the peripheral margins of the diaphragm 251 to pressure seal it into the underlying groove formed in the top surface of the bottom plate and which defines the cavity 288 within which is captured the spring plate 271 previously described, dimensioned to impose a constant upward pressure on the underside of the diaphragm 251, thus causing the pivoted end 289 of the clamp member 236 to be elevated, causing the clamp member 236 to pivot clockwise about then pin 291 as a fulcrum, and thus causing the lower edge 292 of the clamp member to be pressed tightly against the peripheral edge zone of the wafer 283 as previously explained. It will thus be seen that by connecting the passageway 293 which terminates at one end in the chamber 288, to a source of vacuum, the diaphragm 251 will be drawn downwardly against the resilient pressure exerted by the spring 271, causing the clamp arm 236 to pivot counterclockwise on the pin 291, thus opening the end-effector by raising the surface 292 of the clamp member from the surface of the wafer, thus releasing the wafer. As previously discussed in regard to the structure depicted in FIG. 24, this structure oper4ates in a fail-safe mode in that once the gripping function has been performed on the wafer, it requires activation of the vacuum system to disengage the clamp member from the wafer, thus insuring that the wafer will not be inadvertently released from the end-effector.

The embodiment of the invention illustrated in FIG. 32, in contrast to the embodiment of the invention illustrated in FIGS. 24, 30 and 31, operates by a standard mode of operation as distinguished from a fail-safe mode of operation. In this embodiment, the end-effector is again provided with a top plate 203 and a bottom plate 204 superimposed one above the other as illustrated and secured by screws as previously described but not shown in this view in the interest to clarity. They are retained in this position by appropriate screws 206 as illustrated in FIGS. 17 and 18. In this embodiment, the diaphragm 251 is again sealingly captured between the top and bottom plates. In this instance, however, the clamp member 236 is pivoted by the projection 241 (FIG. 26) and a pin 266, while the left end of the clamp member 236 (FIG. 32) is pivoted by a pin 242 in the projection 239. The diaphragm 251 seals the chamber 278 and a vacuum passageway 284 is provided for connection to an appropriate source of vacuum pressure. Disposed below the diaphragm 251 as previously described is a spring plate 271 that exerts an upward pressure on the diaphragm 251, causing the midportion of the clamp arm 236 to be elevated, pivoting counterclockwise about the pin 242 at the left end of the clamp arm, and thus causing the clamping face 292 to normally be elevated and retained in an open condition by virtue of the pressure exerted by the spring plate 271. Thus, in this mode of operation, the wafer 283 is inserted into the normally-open gap between the surface 292 of the clamp member and the bottom surface 282 of the bottom plate, and once properly inserted and positioned, suitable switches as previously described activate the vacuum system to draw or create a vacuum in the chamber 278, causing the diaphragm to descend, pulling then pivot pin 266 downwardly, and causing the clamping ace 292 of the clamp member to impinge tightly against the "free-zone" surrounding the peripheral portion of the wafer 283. Once the wafer has been properly inserted, positioned and clamped, the indicator 207 illustrated in FIG. 17 indicates the condition that exists, and in this case would indicate that clamping of the wafer has been completed.

Referring to FIG. 33, the embodiment of the invention illustrated operates in a normally open mode of operation and utilizes the components illustrated in FIGS. 29 and 30, with the exception that in this normally open embodiment of the invention, the clamp arm 236 is connected by the projection 241 and an appropriate pin 266 to the piston which in this embodiment is of the type of two-part piston that is illustrated in FIG. 29 and designated by the reference numeral 288'.

Thus, the piston parts are juxtaposed with a space between them to accept the width of the clamp arm 236 and a pin 266 extends through both of the piston parts 288', and forms a pivotal journal for the clamp arm 236. The left end of the clamp arm 236, as shown in FIG. 33, is pivotally secured between the top and bottom plates by a pin 293 so that as the diaphragm 251 is elevated by the spring 271 (FIG. 28(A), the clamp arm 236 is caused to pivot counterclockwise about the pin 293, thus elevating the grip members 246 of the clamp arm, and opening the gap in the end-effector to receive appropriate insertion of the wafer 283.

Once the wafer has been properly inserted, positioned and an indication given by the indicator 207 that it is properly loaded, a vacuum pump (not shown) is actuated to draw air from the chamber 288 through a passageway 284 as previously described, and the negative pressure within the chamber 288 causes the diaphragm 251 to be drawn downwardly against the pressure exerted against the diaphragm by the spring 271. Such downward movement of the diaphragm causes the clamp member 236 to pivot clockwise, bringing the clamp members 246 downwardly into impinging contact with the peripheral "free-zone" of the wafer 283. It will thus be seen that this structure operates in a normally-open, "standard" mode of operation in which retention of the wafer by the gripping members 246 is dependent upon the integrity of the vacuum system that retains the diaphragm 251 drawn downwardly against the pressure of the spring 271. This the "standard" method that is utilized in the integrated circuit wafer industry to retain wafers "clamped" on the conventional vacuum operated surface of end-effectors that engage the bottom side or surface of the wafer. Accordingly, the end-effector of this embodiment is readily applicable to existing conventional equipment that is utilized in the vacuum-retention type of equipment. The advantage of this structure however is that no portion of the end-effector contacts the contamination-sensitive surfaces of the wafer, thus eliminating contamination which would otherwise be produced from handling and increasing the percentage of usable wafers that are produced without contamination.

Having thus described the invention, what is believed to be new and novel and sought to be protected by letters patent of the United States is as follows:

I claim:

1. Handling apparatus for gripping an integrated circuit wafer symmetrical about a central axis that includes opposed top and bottom surfaces, at least one of which includes a circular surface area constituting a non-intrusion area and having an outer perimeter spaced radially inwardly from the outer periphery of the integrated circuit wafer and on which circular non-intrusion area are embedded individual integrated circuits, the annular surface defined between the perimeter of said circular non-intrusion area and the periphery of said wafer constituting a free-zone by which said wafer may be grasped, comprising:

a) confronting top and bottom plates non-adjustably spaced to define a hollow shell having an opening of fixed dimension constituting a slot therein for receiving a peripheral edge portion of said integrated circuit wafer that projects into said shell through said opening; and b) means within said hollow shell selectively actuable to effect gripping impingement of said annular free-zone surface area of said wafer defined between the perimeter of said circular non-intrusion area and the peripheral edge of said wafer that projects into said hollow shell through said opening, said gripping impingement being effected in a direction perpendicular to the top and bottom surfaces of said wafer.

2. The handling apparatus according to claim 1, wherein said confronting top and bottom plates are peripherally detachably secured to one another except in the region of said opening constituting said slot.

3. The handling apparatus according to claim 1, wherein said confronting top and bottom plates each include arcuate surface portions defined by inner and outer peripheries spaced to correspond with said annular surface of said wafer defined by the outer perimeter of said circular non-intrusion area and the circular periphery of said wafer, and said opening is disposed between said inner and outer peripheries of said top and bottom plates.

4. The handling apparatus according to claim 3, wherein said inner peripheries of said arcuate surface portions of said top and bottom plates are beveled.

5. The handling apparatus according to claim 1, wherein said confronting top and bottom plates each include arcuate portions defined by inner and outer peripheries, and a mounting member extends integrally and diametrically from the outer periphery of each top and bottom plate.

6. The handling apparatus according to claim 1, wherein said means within said hollow shell selectively actuable to grippingly impinge perpendicularly said peripheral free-zone edge portion of said wafer includes means to limit projection of said peripheral free-zone edge portion through said opening to a predetermined amount.

7. The handling apparatus according to claim 1, wherein means are provided mounted within said hollow shell actuable by projection of said peripheral edge portion of said wafer through said opening to indicate proper placement of said wafer in relation to said handling apparatus and to initiate actuation of said means to perpendicularly grip said peripheral free-zone edge portion of said wafer that projects through said opening.

8. The handling apparatus according to claim 7, wherein said means mounted in said shell actuable by projection of said peripheral free-zone edge portion of said wafer through said opening comprise a plurality of microswitches, each microswitch including an actuator arm extending into the path of entry of said peripheral free-zone edge portion of said wafer.

9. The handling apparatus according to claim 1, wherein means are provided mounted in said hollow shell operable to optically sense the presence of a wafer to be grasped, and operable to initiate manipulation of said handling apparatus to effect gripping engagement of said sensed integrated circuit wafer.

10. The handling apparatus according to claim 1, wherein each of said top and bottom plates includes an inner surface and an outer surface, an arcuate recess in the inner surface of each of said top and bottom plates defining the interior of said hollow shell, said means within said hollow shell selectively actuable to grippingly impinge said peripheral free-zone edge portion of said integrated circuit wafer is mounted in the arcuate recess of one of said top or bottom plates and includes a plurality of laterally spaced radially extending cantilever-like beams, the distal end portion of each beam lying adjacent a peripheral free-zone edge portion of said wafer that projects through said opening, means interposed between the distal end portion of each beam and the inner surface of one of said top or bottom plates and normally biasing said distal end portion of each beam away from said peripheral free-zone edge portion of said wafer that projects through said opening, and means interposed between one of said top or bottom plates and said cantilever-like beams and selectively actuable to displace said beams into gripping impingement with said peripheral free-zone edge portion of said wafer to lock said wafer to said handling apparatus.

11. The handling apparatus according to claim 10, wherein said means interposed between the distal end portion of each beam and the inner surface of said top or bottom plate and normally biasing said distal end portion of each beam away from said peripheral free-zone edge portion of said wafer comprises a spring.

12. The handling apparatus according to claim 11, wherein said means interposed between said top or bottom plates and said cantilever-like beams and selectively actuable to displace said beams into gripping engagement with said peripheral free-zone edge portion of said wafer comprises a selectively inflatable and deflatable bladder which when inflated displaces said beams against the resilient force exerted by said springs to cause gripping impingement of the distal end portions of said beams against said peripheral free-zone edge portion of said wafer to thus bind the wafer to said shell and when deflated enables said springs to expand to displace said beams to release said wafer.

13. The handling apparatus according to claim 1, wherein each of said top and bottom plates includes an inner surface and an outer surface, an arcuate recess in the inner surface of each of said top and bottom plates defining the interior of said hollow shell, said means within said hollow shell selectively actuable to grip said peripheral free-zone edge portion of said wafer is mounted on said bottom plate in operative association with the recess therein and includes:

a) a displaceable elastic diaphragm having top and bottom surfaces and a peripheral edge portion sealingly compressed between said top and bottom plates and operatively spanning the recess in said bottom plate;

b) at least one spring mounted on the bottom surface of said diaphragm and impinging on the bottom plate within said recess therein whereby said diaphragm is elevated away from said bottom plate by said spring;

c) at least one mounting block mounted on the top surface of said diaphragm in superposed relation to said spring and connected thereto;

d) a clamp arm pivotally mounted on said mounting block and extending transversely across said diaphragm, said clamp arm comprising an elongated stem portion having a proximate pivot portion adjacent one end, an intermediate pivot portion and a clamp portion on the distal end of said stem remote from said proximate pivot portion, said clamp portion having at least one clamp finger having a clamp surface adapted to selectively engage said peripheral free-zone edge portion of said wafer and e) a passageway in at least one of said top and bottom plates communicating with the interior of said recess below said diaphragm and selectively connected to a source of negative pressure to lower the mounting block when said recess is subjected to negative pressure and said diaphragm is drawn downwardly into said recess.

14. The handling apparatus according to claim 13, wherein said proximate pivot portion of said stem portion is pivotally mounted on said mounting block and said intermediate pivot portion of said stem portion is pivotally mounted on said bottom plate, whereby when said diaphragm is elevated by said spring said clamp portion is pivoted into engagement with said peripheral free-zone edge portion of said wafer to retain said wafer secured to said-handling apparatus.

15. The handling apparatus according to claim 14, wherein when said recess below said diaphragm is selectively connected to a source of negative pressure so that said diaphragm is selectively drawn into said recess, said mounting block descends with said diaphragm, and said clamp arm is pivoted counterclockwise to disengage said clamp finger from said peripheral free-zone edge portion of said wafer thus releasing said wafer.

16. The handling apparatus according to claim 14, wherein a plurality of said means actuable to grip said peripheral free-zone edge portion of said wafer are mounted within said hollow shell, each said means acting in concert with the other means to selectively grip the peripheral free-zone edge portion of said wafer.

17. The handling apparatus according to claim 13, wherein said proximate pivot portion of said stem portion is pivoted to said bottom plate and said intermediate pivot portion of said stem portion is pivoted on said mounting block, whereby when said diaphragm is elevated by said spring said clamp portion is pivoted out of gripping engagement with said peripheral free-zone edge portion of said wafer to release said wafer.

18. The handling apparatus according to claim 17, wherein when said recess below said diaphragm is connected to a source of negative pressure, said diaphragm is drawn into said recess, said mounting block descends with said diaphragm, and said clamp arm pivots clockwise to engage said clamp portion with said peripheral free-zone edge portion of said wafer.

19. The handling apparatus according to claim 13, wherein a plurality of said means actuable to grip said peripheral free-zone edge portion of said wafer are mounted within said hollow shell, each said means acting in concert with the other means to selectively grip the peripheral free-zone edge portion of said wafer.

20. The handling apparatus according to claim 1, wherein means are provided mounted on said top plate to visually indicate the status of the handling apparatus in relation to said peripheral free-zone edge portion of a wafer as "ready", "loaded" and "clamped".

21. As an article of manufacture, a clamp structure for use in conjunction with a handling apparatus to effect gripping impingement of a peripheral free-zone edge portion of an integrated circuit wafer, said clamp structure comprising:
   a) an elongated plate-like strip having two longitudinal edges spaced apart and a walled channel formed integrally along one longitudinal edge thereof;
   b) a plurality of equally spaced slots formed in said plate-like strip extending transversely from one longitudinal edge to said walled channel and dividing said plate-like strip into a plurality of laterally spaced transversely extending cantilever-like beams each having a root end flexibly joined to said walled channel and having a distal end portion remote from said root end and said walled channel for overlying and gripping a peripheral free-zone edge portion of said wafer.

22. The clamp structure according to claim 21, wherein said root end of each cantilever-like beam has a width less than the remainder of the beam.

23. The clam structure according to claim 21, wherein an aperture is provided in said plate-like strip at the end of each said slot adjacent said walled channel to diminish the width of the root end of each beam and thus increase the flexibility of the union of each beam with the walled channel.

24. The clamp structure according to claim 23, wherein the root end of each beam between said apertures is narrowed to provide a width less than the remainder of the beam to thus further increase the flexibility of the union of each beam to the walled channel.

25. Handling apparatus for gripping a wafer-like article that includes opposed surfaces, comprising:
   a) confronting top and bottom plates arranged to define a hollow shell having an opening therein for receiving a peripheral edge portion of said wafer-like article that projects into said shell through said opening;
   b) means within said hollow shell selectively actuable to effect gripping impingement of said peripheral edge portion of said article that projects into said hollow shell through said opening;
   c) wherein each of said top and bottom plates includes an inner surface and an outer surface, an arcuate recess in the inner surface of each of said top and bottom plates defining the interior of said hollow shell, said means within said hollow shell selectively actuable to grip said peripheral edge portion of said article is mounted in the arcuate recess of said bottom plate and includes a plurality of laterally spaced radially extending cantilever-like beams, the distal end portion of each beam overlying a peripheral edge portion of said wafer-like article that projects through said opening;
   d) means interposed between the distal end portion of each beam and the inner surface of said top plate and normally biasing said distal end portion of each beam to impinge against said peripheral edge portion of said article that projects through said opening to clasp said peripheral edge portion between said beam and said bottom plate; and
   e) means interposed between said lower plate and said cantilever-like beams and selectively actuable to displace said beams away from said peripheral edge portion of said article to release said wafer-like article for removal of said handling apparatus.

26. The handling apparatus according to claim 25, wherein said means interposed between the distal end portion of each beam and the inner surface of said top plate includes a spring.

27. The handling apparatus according to claim 25, wherein said means interposed between said lower plate and said cantilever-like beams and selectively actuable to displace said beams away from said peripheral edge portion of said article includes a selectively inflatable and deflatable bladder.

28. The handling apparatus according to claim 27, wherein means are provided within said hollow shell communicating the interior of said selectively inflatable and deflatable bladder to a source of pressurized fluid to selectively effect inflation of said bladder and consequent displacement of said beams away from said lower plate to enable projection off said peripheral edged portion of said article into said hollow shell and subsequently selectively deflatable to enable said gripping means within said hollow shell to be resilient biased into gripping engagement with said peripheral edge portion of said article.

29. Handling apparatus for gripping a wafer-like article that includes opposed surfaces, comprising:
   a) confronting top and bottom plates arranged to define a hollow shell having an opening therein for receiving a peripheral edge portion of said wafer-like article that projects into said shell through said opening;

b) means within said hollow shell selectively actuable to effect gripping impingement of said peripheral edge portion of said article that projects into said hollow shell through said opening;

c) wherein said means within said hollow shell selectively actuable to grip said peripheral edge portion of said wafer-like article includes a plurality of cantilever-like beams, the distal end portions of which lie in gripping relation to said peripheral edge portion of said wafer-like article when inserted through said opening;

d) means interposed between each beam and the top plate normally resiliently biasing said distal end portion of each beam into gripping engagement with the associated peripheral edge portion of said wafer-like article that projects through said opening; and e) means selectively actuable to elevate said distal ends of said beams to enable projection of said peripheral edge portion of said article through said opening whereupon said selectively actuable means is deactivated to enable said means interposed between each beam and the top plate to displace each beam into gripping engagement with said peripheral edge portion of said article that projects through said opening to clamp said peripheral edge portion between said beam and said bottom plate.

30. Handling apparatus for gripping a wafer-like article that includes opposed surfaces comprising:

a) confronting top and bottom plates arranged to define a hollow shell having an opening therein for receiving a peripheral edge portion of said wafer-like article that projects into said shell through said opening.

b) means within said hollow shell selectively actuable to effect gripping impingement of said peripheral edge portion of said article that projects into said hollow shell through said opening;

c) wherein each of said top and bottom plates includes an inner surface and an outer surface;

d) an arcuate recess in the inner surface of at least one of said top and bottom plates;

e) said means within said hollow shell selectively actuable to grippingly impinge said peripheral edge portion of said article is mounted in said arcuate recess in one of said top and bottom plates and includes a plurality of laterally spaced radially extending cantilever-like beams, the distal end portion of each beam lying adjacent a peripheral edge portion of said wafer-like article when it projects through said opening;

f) means interposed between the distal end portion of each beam and the inner surface of one of said top and bottom plates and normally biasing said distal end portion of each beam to grippingly impinge against said peripheral edge portion between said beam and one of said top and bottom plates; and g) means interposed between one of said top and bottom plates and said cantilever-like beams and selectively actuable to displace said beams away from said peripheral edge portion of said article to release said wafer-like article for removal from said handling apparatus.

31. The handling apparatus according to claim 30, wherein said means interposed between the distal end portion of each beam and the inner surface of one of said top and bottom plates and normally biasing said distal end portion of each beam to grippingly impinge against said peripheral edge portion of said article to clamp said article to one of said top and bottom plates comprises a spring.

32. The handling apparatus according to claim 30, wherein said means interposed between one of said top and bottom plates and said cantilever-like beams and selectively actuable to displace said beams away from said peripheral edge portion of said article to effect release of said article comprises a selectively inflatable and deflatable bladder which when inflated compresses said springs to release said article and when deflated enables said springs to expand to displace said beams into gripping position.

33. The handling apparatus according to claims 1, 2, 3, 5, 6, 26, 27, 7, 9, 28, 4, 10, 31, 32, 11, 12, 13, 14, 17, 15, 18, 19, 16, 8, 20, 21, 22, 23, 24, 25, 29, 30, wherein said handling apparatus comprises an end-effector and said integrated circuit semiconductor wafer has an annular peripheral "free zone" portion surrounding a "non-intrusion" area, said integrated circuit semiconductor wafer ranging in diameter from approximately 4" to 12" and having various thicknesses averaging approximately 0.030".

\* \* \* \* \*